(12) United States Patent
Miyamoto

(10) Patent No.: US 7,397,286 B2
(45) Date of Patent: Jul. 8, 2008

(54) FLIP-FLOP CIRCUIT INCLUDING LATCH CIRCUITS

(75) Inventor: Hideaki Miyamoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 17 days.

(21) Appl. No.: 11/274,298

(22) Filed: Nov. 16, 2005

(65) Prior Publication Data
US 2006/0139077 A1 Jun. 29, 2006

(30) Foreign Application Priority Data
Dec. 27, 2004 (JP) .............................. 2004-375148

(51) Int. Cl.
*G11C 7/00* (2006.01)
(52) U.S. Cl. ........................................ 327/57; 365/205
(58) Field of Classification Search .................... 327/55, 327/57; 365/205
See application file for complete search history.

(56) References Cited

U.S. PATENT DOCUMENTS

| | | | | |
|---|---|---|---|---|
| 5,023,841 A * | 6/1991 | Akrout et al. | ................ | 365/205 |
| 6,392,944 B1 * | 5/2002 | Kono | .......................... | 365/208 |
| 7,002,864 B2 * | 2/2006 | Kim et al. | ..................... | 365/205 |
| 7,099,217 B2 * | 8/2006 | Haga et al. | .................... | 365/205 |
| 7,227,799 B2 * | 6/2007 | Vogelsang | ................... | 365/205 |
| 7,233,536 B2 * | 6/2007 | Ogiwara et al. | ............. | 365/205 |
| 2001/0001598 A1 * | 5/2001 | Narui et al. | .................. | 365/149 |

FOREIGN PATENT DOCUMENTS

JP 8-279298 A 10/1996

* cited by examiner

*Primary Examiner*—N. Drew Richards
*Assistant Examiner*—William Hernandez
(74) *Attorney, Agent, or Firm*—McDermott Will & Emery LLP

(57) ABSTRACT

A flip-flop circuit capable of inhibiting current consumption as well as the circuit scale from increase is provided. This flip-flop circuit comprises a first latch circuit including first and second inverter circuits. A first power supply line capable of switching a supplied potential between a fixing potential supplied for fixing the potentials of output nodes of the first and second inverter circuits and a floating potential supplied for floating the potentials of the output nodes of the first and second inverter circuits is connected to the first latch circuit.

8 Claims, 9 Drawing Sheets

US 7,397,286 B2

FLIP-FLOP CIRCUIT INCLUDING LATCH CIRCUITS

BACKGROUND OF THE INVENTION

1. Field of the Invention

The present invention relates to a flip-flop circuit, and more particularly, it relates to a flip-flop circuit including latch circuits.

2. Description of the Background Art

A flip-flop circuit including various latch circuits is known in general. For example, Japanese Patent Laying-Open No. 8-279298 (1997) discloses such a flip-flop circuit.

FIG. 11 shows an exemplary conventional flip-flop circuit 101 having a structure similar to that of the aforementioned flip-flop circuit disclosed in Japanese Patent Laying-Open No. 8-279298. As shown in FIG. 11, the exemplary conventional flop-flop circuit 101 is constituted of two delay latch circuits 102a and 102b and an inverter circuit 103. The first-stage delay latch circuit 102a is constituted of a latch circuit 104 and a transfer gate transistor 105. The latch circuit 104 is constituted of two inverter circuits 106 and 107 and a transfer gate transistor 108.

Output terminals of the inverter circuits 106 and 107 are connected to input terminals of the inverter circuits 107 and 106 respectively. The output terminal of the inverter circuit 106 and the input terminal of the inverter circuit 107 are connected with each other through the transfer gate transistor 108 formed by a p-channel transistor 108a and an n-channel transistor 108b. A clock signal CLK and an inverted clock signal /CLK obtained by inverting the clock signal CLK by the inverter circuit 103 are input in the gates of the n-channel transistor 108b and the p-channel transistor 108a of the transfer gate transistor 108 respectively. Either the source region or the drain region of the transfer gate transistor 105 formed by a p-channel transistor 105a and an n-channel transistor 105b is connected to a node N101 between the input terminal of the inverter circuit 107 and the transfer gate transistor 108. A prescribed potential is input in either the drain region or the source region of the transfer gate transistor 105 from a node D. The clock signal CLK and the inverted clock signal /CLK obtained by inverting the clock signal CLK by the inverter circuit 103 are input in the gates of the p-channel transistor 105a and the p-channel transistor 105b of the transfer gate transistor 105 respectively.

The second-stage delay latch circuit 102b has a structure similar to that of the aforementioned first-stage delay latch circuit 102a. However, either the source region or the drain region of a transfer gate transistor 105 constituting the second-stage delay latch circuit 102b is connected to the node N102 of the first-stage delay latch circuit 102a between the input terminal of the inverter circuit 106 and the output terminal of the inverter circuit 107. Thus, a potential output from the node 102 of the first-stage delay latch circuit 102a is input in a node N103 through the transfer gate transistor 105 of the second-stage delay latch circuit 102b.

An operation of the exemplary conventional flip-flop circuit 101 shown in FIG. 11 for introducing a potential Vdd received in the node D into the node N101 of the first-stage delay latch circuit 102a is now described. It is assumed that the flip-flop circuit 101 holds the potential of the node N101 at a level Vss through the output potential of the inverter circuit 106 before introducing the potential Vdd from the node D. In this case, the clock signal CLK first falls to the potential Vss. Thus, both of the p-channel transistor 105a and the n-channel transistor 105b of the transfer gate transistor 105 receiving the clock signal CLK and the inverted clock signal /CLK in the gates thereof respectively enter ON-states. Thus, the flip-flop circuit 101 inputs the potential Vdd of the node D in the node N101 through the transfer gate transistor 105. At this time, both of the n-channel transistor 108b and the p-channel transistor 108a of the transfer gate transistor 108 receiving the clock signal CLK and the inverted clock signal /CLK in the gates thereof respectively enter OFF-states. Thus, the flip-flop circuit 101 transmits no output potential (Vss) of the inverter circuit 106 the node N101, thereby not fixing the potential of the node N101 to the level Vss. Therefore, the flip-flop circuit 101 inhibits the potential Vdd of the node D and the potential of the node N101 (output potential of the inverter circuit 106) from colliding with each other when introducing the potential Vdd from the node D into the node N101. Thus, the flip-flop circuit 101 inhibits current consumption from increase resulting from collision between the potential Vdd of the node D and the potential of the node N101.

The exemplary conventional flip-flop circuit 101 shown in FIG. 11 is provided with the transfer gate transistor 108 formed by the p-channel transistor 108a and the n-channel transistor 108b for inhibiting the output potential of the inverter circuit 106 from transmission to the node N101 when introducing the potential of the node N into the node N101, in order to inhibit current consumption from increase resulting from collision between the potential of the node D and the output potential of the inverter circuit 106 (potential of the node N101). In the exemplary conventional flip-flop circuit 101, therefore, the circuit scale is disadvantageously increased due to the transfer gate transistor 108.

SUMMARY OF THE INVENTION

The present invention has been proposed in order to solve the aforementioned problem, and an object of the present invention is to provide a flip-flop circuit capable of suppressing increase of the circuit scale while suppressing increase of current consumption.

In order to attain the aforementioned object, a flip-flop circuit according to an aspect of the present invention comprises a first latch circuit including a first inverter circuit and a second inverter circuit as well as a first equalizer circuit equalizing the potential of an output node of the first inverter circuit and the potential of an output node of the second inverter circuit with each other. A first power supply line capable of switching a supplied potential between a fixing potential supplied for fixing the potential of the output node of the first inverter circuit and the potential of the output node of the second inverter circuit and a floating potential supplied for floating the potential of the output node of the first inverter circuit and the potential of the output node of the second inverter circuit is connected to the first latch circuit.

In the flip-flop circuit according to this aspect, as hereinabove described, the first power supply line capable of switching the supplied potential between the fixing potential for fixing the potentials of the output nodes of the first and second inverter circuits and the floating potential for floating the potentials of the output nodes of the first and second inverter circuits is so connected to the first latch circuit that the flip-flop circuit, turning off all transistors constituting the first latch circuit for inactivating the first latch circuit through gate-to-source voltages Vgs of the transistors by supplying the floating potential (Vss, for example) to the first latch circuit when inputting a prescribed potential in the output node in either the first inverter circuit or the second inverter circuit of the first latch circuit, can float the potentials of both of the output nodes of the first and second inverter circuits constituting the first latch circuit. Thus, the flip-flop circuit can inhibit the aforementioned prescribed potential and the potential of the output node of either the first inverter circuit or the second inverter circuit from colliding with each other. Therefore, the flip-flop circuit, capable of inhibiting current consumption from increase resulting from collision between the prescribed potential input in the first latch circuit and the potential of the output node of either the first inverter circuit or the second inverter circuit, can suppress increase of current consumption. According to the aforementioned structure, further, the flip-flop circuit, capable of floating the potentials of both of the output nodes of the first and second inverter circuits constituting the first latch circuit by supplying the floating potential to the first latch circuit when inputting the prescribed potential in the output node of either the first inverter circuit or the second inverter circuit, can inhibit the prescribed input potential and the potential of the output node of either the first inverter circuit or the second inverter circuit from colliding with each other. Thus, the flip-flop circuit may be provided with no transistor for inhibiting the output potential from either the first inverter circuit or the second inverter circuit from transmission to a node receiving the aforementioned prescribed input potential. Therefore, the flip-flop circuit can suppress increase of the circuit scale while suppressing increase of current consumption.

Further, the first equalizer circuit equalizing the potentials of the output nodes of the first and second inverter circuits with each other is so provided that the flip-flop circuit can inhibit an input potential Vdd or Vss input in the output node of either the first inverter circuit or the second inverter circuit and the potential of the output node of either the second inverter circuit or the first inverter circuit from reaching the same level by equalizing the potentials of the output nodes of the first and second inverter circuits with each other to an intermediate potential ½Vdd between the potentials Vdd and Vss through the first equalizer circuit, for example. Also when determining whether the potential of the output node of either the first inverter circuit or the second inverter circuit receiving the potential Vdd or Vss is higher or lower than that of the output node of either the second inverter circuit or the first inverter circuit in the first latch circuit, therefore, the flip-flop circuit can avoid difficulty in this determination.

The flip-flop circuit according to the aforementioned aspect preferably holds the first power supply line at the floating potential when inputting a prescribed potential in the output node of either the first inverter circuit or the second inverter circuit. According to this structure, the flip-flop circuit, turning off all transistors constituting the first latch circuit for inactivating the first latch circuit through the gate-to-source voltages Vgs of the transistors when inputting the prescribed potential in the output node of either the first inverter circuit or the second inverter circuit, can easily float the potential of the output node of the inverter circuit of the first latch circuit receiving the prescribed potential. Thus, the flip-flop circuit can easily inhibit the prescribed input potential and the potential of the output node of either the first inverter circuit or the second inverter circuit receiving this potential from colliding with each other.

In this case, the first power supply line preferably includes a first potential supply line and a second potential supply line supplied with a potential inverted with respect to a potential supplied to the first potential supply line, and the first potential supply line is preferably held at a first potential while the second potential supply line is held at a second potential when the prescribed potential is input in the output node of either the first inverter circuit or the second inverter circuit. According to this structure, the flip-flop circuit can easily float the potentials of the output nodes of the first and second inverter circuits by holding the first and second potential supply lines at the first and second potentials respectively when floating the potentials of the output nodes of the first and second inverter circuits through the first potential and the second potential inverted with respect to the first potential.

In the aforementioned structure having the first power supply line including the first and second potential supply lines, the first inverter circuit preferably includes a p-type first transistor and an n-type second transistor while the second inverter circuit preferably includes a p-type third transistor and an n-type fourth transistor, the gates of the p-type first transistor and the n-type second transistor of the first inverter circuit are preferably connected to the output node of the second inverter circuit while the gates of the p-type third transistor and the n-type fourth transistor of the second inverter circuit are preferably connected to the output node of the first inverter circuit, and the first potential supply line is preferably connected to either the source region or the drain region of the p-type first transistor of the first inverter circuit and either the source region or the drain region of the p-type third transistor of the second inverter circuit while the second potential supply line is preferably connected to either the source region or the drain region of the n-type second transistor of the first inverter circuit and either the source region or the drain region of the n-type fourth transistor of the second inverter circuit. According to this structure, the flip-flop circuit can control the gate-to-source voltages of the first to fourth transistors by controlling the holding potentials of the first and second potential supply lines on the basis of the potentials of the output nodes of the first and second inverter circuits. Thus, the flip-flop circuit can easily float the potentials of the output nodes of the first and second inverter circuits by turning off all of the first to fourth transistors when inputting the prescribed potential in the output node of either the first inverter circuit or the second inverter circuit.

In the aforementioned structure having the first and second inverter circuits including the first and second transistors and the third and fourth transistors respectively, the flip-flop circuit preferably holds the first potential supply line at the second potential while holding the second potential supply line at the first potential when fixing the potential of the output node of the first inverter circuit and the potential of the output node of the second inverter circuit, and preferably turns off all of the first and second transistors of the first inverter circuit and the third and fourth transistors of the second inverter circuit by switching the potential of the first potential supply line from the second potential to the first potential while switching the second potential supply line from the first potential to the second potential when floating the potential of the output node of the first inverter circuit and the output node of the second inverter circuit. According to this structure, the flip-flop circuit can easily switch the output nodes of the first and second inverter circuits from fixed states to floating states.

In the flip-flop circuit according to the aforementioned aspect, the first equalizer circuit preferably equalizes the potentials of the output nodes of the first and second inverter circuits with each other before a prescribed potential is input in the output node of either the first inverter circuit or the second inverter circuit. According to this structure, the flip-flop circuit can easily inhibit the potential Vdd or Vss input in the output node of either the first inverter circuit or the second inverter circuit and the potential of the output node of either the second inverter circuit or the first inverter circuit from reaching the same level by equalizing the potentials of the output nodes of the first and second inverter circuits with each other to the level ½Vdd before inputting the prescribed potential in the output node of the first inverter circuit, for example.

In this case, the first equalizer circuit is preferably constituted of a transistor, and either the source region or the drain region of the transistor constituting the first equalizer circuit is preferably connected to the output node of the first inverter circuit, while either the drain region or the source region of the transistor constituting the first equalizer circuit is preferably connected to the output node of the second inverter circuit. According to this structure, the flip-flop circuit can easily equalize the potentials of the output nodes of the first and second inverter circuits with each other by turning on transistor constituting the first equalizer circuit.

In the aforementioned structure equalizing the potentials of the output nodes of the first and second inverter circuits with each other before inputting the prescribed potential in the output node of either the first inverter circuit or the second inverter circuit, the first latch circuit preferably further includes a transfer gate transistor, and the prescribed potential is preferably input in the output node of either the first inverter circuit or the second inverter circuit through the transfer gate transistor. According to this structure, the flip-flop circuit can inhibit the output node of either the first inverter circuit or the second inverter circuit from receiving the prescribed potential by turning off the transfer gate transistor. Thus, the flip-flop circuit can easily equalize the potentials of the output nodes of the first and second inverter circuits with each other before inputting the prescribed potential in the output node of either the first inverter circuit or the second inverter circuit by equalizing the potentials with each other through the first equalizer circuit while turning off the transfer gate transistor.

The flip-flop circuit according to the aforementioned aspect preferably further comprises a second latch circuit including a third inverter circuit having an output node connected to the output node of either the first inverter circuit or the second inverter circuit of the first latch circuit, a fourth inverter circuit and a second equalizer circuit equalizing the potential of the output node of the third inverter circuit and the potential of an output node of the fourth inverter circuit with each other, while a second power supply line capable of switching a supplied potential to the fixing potential supplied for fixing the potential of the output node of the third inverter circuit and the potential of the output node of the fourth inverter circuit and the floating potential supplied for floating the potential of the output node of the third inverter circuit and the potential of the output node of the fourth inverter circuit is preferably connected to the second latch circuit. According to this structure, transistors constituting the first latch circuit partially enter ON-states for activating the first latch circuit while all transistors constituting the second latch circuit enter OFF-states for inactivating the second latch circuit through the gate-to-source voltages Vgs of the transistors when the flip-flop circuit supplies the fixing potential (Vdd, for example) and the floating potential (Vss, for example) to the first and second latch circuits. Thus, the flip-flop circuit fixes the potentials of the output nodes of the first and second inverter circuits constituting the first latch circuit while floating the potentials of the output nodes of the third and fourth inverter circuits constituting the second latch circuit. Thereafter the flip-flop circuit can float the potentials of both of the output nodes of the third and fourth inverter circuits at the potential ½Vdd in the second latch circuit by equalizing the potentials of the output nodes of the third and fourth inverter circuits of the second latch circuit with each other to the level ½Vdd through the second equalizer circuit. Thus, the flip-flop circuit can easily transfer the potential of the output node of either the first inverter circuit or the second inverter circuit of the first latch circuit to the second latch circuit with no potential collision by inputting the fixed potential of the output node of either the first inverter circuit or the second inverter circuit in the floating output node of the third inverter circuit. Thereafter the flip-flop circuit can determine whether the potential transferred from the first latch circuit is higher or lower than the potential ½Vdd of the output node of the fourth inverter circuit and fix the same by switching the potential supplied to the second latch circuit to the fixing potential.

When the flip-flop circuit supplies the fixing potential (Vdd, for example) and the floating potential (Vss, for example) to the second and first latch circuits respectively, the transistors constituting the second latch circuit partially enter ON-states for activating the second latch circuit while all transistors constituting the first latch circuit enter OFF-states for inactivating the first latch circuit through the gate-to-source voltages Vgs of the transistors. Thus, the flip-flop circuit fixes the potentials of the output nodes of the third and fourth inverter circuits constituting the second latch circuit while floating the potentials of the output nodes of the first and second inverter circuits constituting the first latch circuit. Thereafter the flip-flop circuit can float the potentials of both of the output nodes of the first and second inverter circuits at the potential ½Vdd in the first latch circuit by equalizing the potentials of the output nodes of the first and second inverter circuits of the first latch circuit with each other to the level ½Vdd through the first equalizer circuit. Thus, the flip-flop circuit can easily transfer the potential of the output node of the third inverter circuit of the second latch circuit to the first latch circuit with no potential collision by inputting the fixed potential of the output node of the third inverter circuit in the floating output node of either the first inverter circuit or the second inverter circuit. Thereafter the flip-flop circuit can determine whether the potential transferred from the second latch circuit is higher or lower than the potential ½Vdd of the output node of either the second inverter circuit or the first inverter circuit receiving this potential and fix the same by switching the potential supplied to the first latch circuit to the fixing potential. According to the aforementioned structure, the flip-flop circuit can bidirectionally transfer potentials from the first latch circuit to the second latch circuit and vice versa, whereby a bidirectional shift register circuit capable of bidirectionally sequentially transferring potentials while shifting timing can be formed by serially connecting a plurality of flip-flop circuits each having the aforementioned structure with each other.

In this case, the flip-flop circuit preferably holds the second power supply line at the floating potential when inputting a prescribed potential in the output node of either the third inverter circuit or the fourth inverter circuit. According to this structure, all transistors constituting the second latch circuit enter OFF-states for inactivating the second latch circuit through the gate-to-source voltages Vgs of the transistors when the flip-flop circuit inputs the prescribed potential in the output node of either the third inverter circuit or the fourth inverter circuit, whereby the flip-flop circuit can easily float the potential of the output node of the inverter circuit of the second latch circuit receiving the prescribed potential. Thus, the flip-flop circuit can easily inhibit the prescribed potential and the potential of the output node of either the third inverter circuit or the fourth inverter circuit receiving the potential from colliding with each other.

In the aforementioned structure holding the second power supply line at the floating potential when inputting the prescribed potential in the output node of either the third inverter circuit or the fourth inverter circuit, the second power supply line preferably includes a third potential supply line and a fourth potential supply line supplied with a potential inverted with respect to a potential supplied to the third potential supply line, and the third potential supply line is preferably held at a first potential while the fourth potential supply line is held at a second potential when the prescribed potential is input in the output node of either the third inverter circuit or the fourth inverter circuit. According to this structure, the flip-flop circuit can easily float the potentials of the output nodes of the third and fourth inverter circuits by holding the third and fourth potential supply lines at the first and second potentials respectively when floating the potentials of the output nodes of the third and fourth inverter circuits through the first potential and the second potential inverted with respect to the first potential.

In the aforementioned structure having the second power supply line including the third and fourth potential supply lines, the third inverter circuit preferably includes a p-type fifth transistor and an n-type sixth transistor while the fourth inverter circuit preferably includes a p-type seventh transistor and an n-type eighth transistor, the gates of the p-type fifth transistor and the n-type sixth transistor of the third inverter circuit are preferably connected to the output node of the fourth inverter circuit while the gates of the p-type seventh transistor and the n-type eighth transistor of the fourth inverter circuit are preferably connected to the output node of the third inverter circuit, and the third potential supply line is preferably connected to either the source region or the drain region of the p-type fifth transistor of the third inverter circuit and either the source region or the drain region of the p-type seventh transistor of the fourth inverter circuit while the fourth potential supply line is preferably connected to either the source region or the drain region of the n-type sixth transistor of the third inverter circuit and either the source region or the drain region of the n-type eighth transistor of the fourth inverter circuit. According to this structure, the flip-flop circuit can control the gate-to-source voltages of the fifth to eighth transistors by controlling the holding potentials of the third and fourth potential supply lines on the basis of the potentials of the output nodes of the third and fourth inverter circuits. Thus, the flip-flop circuit can easily float the potentials of the output nodes of the third and fourth inverter circuits by turning off all of the fifth to eighth transistors when inputting the prescribed potential in the output node of either the third inverter circuit or the fourth inverter circuit.

In the aforementioned structure having the third and fourth inverter circuits including the fifth and sixth transistors and the seventh and eighth transistors respectively, the flip-flop circuit preferably holds the third potential supply line at the second potential while holding the fourth potential supply line at the first potential when fixing the potential of the output node of the third inverter circuit and the potential of the output node of the fourth inverter circuit, and preferably turns off all of the fifth and sixth transistors of the third inverter circuit and the seventh and eighth transistors of the fourth inverter circuit by switching the potential of the third potential supply line from the second potential to the first potential while switching the potential of the fourth potential supply line from the first potential to the second potential when floating the potential of the output node of the third inverter circuit and the output node of the fourth inverter circuit. According to this structure, the flip-flop circuit can easily switch the output nodes of the third and fourth inverter circuits from fixed states to floating states.

In the aforementioned structure further comprising the second latch circuit, the second equalizer circuit preferably equalizes the potential of the output node of the third inverter circuit and the potential of the output node of the fourth inverter circuit with each other before a prescribed potential is input in the output node of either the third inverter circuit or the fourth inverter circuit. According to this structure, the flip-flop circuit can easily inhibit the potential Vdd or Vss input in the output node of either the third inverter circuit or the fourth inverter circuit and the potential of the output node of either the fourth inverter circuit or the third inverter circuit from reaching the same level by equalizing the potentials of the output nodes of the third and fourth inverter circuits with each other to the level ½Vdd through the second equalizer circuit before inputting the prescribed potential in the output node of the third inverter circuit, for example.

In the aforementioned structure having the second equalizer circuit equalizing the potentials of the output nodes of the third and fourth inverter circuits with each other, the second equalizer circuit is preferably constituted of a transistor, and either the source region or the drain region of the transistor constituting the second equalizer circuit is preferably connected to the output node of the third inverter circuit, while either the drain region or the source region of the transistor constituting the second equalizer circuit is preferably connected to the output node of the fourth inverter circuit. According to this structure, the flip-flop circuit can easily equalize the potentials of the output nodes of the third and fourth inverter circuits with each other by turning on the transistor constituting the second equalizer circuit.

In the aforementioned structure equalizing the potentials of the output nodes of the third and fourth inverter circuits with each other before inputting the prescribed potential in the output node of either the third inverter circuit or the fourth inverter circuit, the second latch circuit preferably further includes a transfer gate transistor, and the prescribed potential is input in the output node of either the third inverter circuit or the fourth inverter circuit through the transfer gate transistor. According to this structure, the flip-flop circuit can inhibit the output node of either the third inverter circuit or the fourth inverter circuit from receiving the prescribed potential by turning off the transfer gate transistor. Thus, the flip-flop circuit can easily equalize the potentials of the output nodes of the third and fourth inverter circuits with each other before inputting the prescribed potential in the output node of either the third inverter circuit or the fourth inverter circuit by equalizing the potentials with each other through the second equalizer circuit while turning off the transfer gate transistor.

In the flip-flop circuit according to the aforementioned aspect, a shift register circuit is preferably constituted of a plurality of serially connected flip-flop circuits. According to this structure, the shift register circuit can be constituted of the flip-flop circuits capable of suppressing increase of current consumption and circuit scale in general, whereby the shift register circuit can be easily inhibited from increase of current consumption and circuit scale. When each of the flip-flop circuits has the aforementioned structure also including the second latch circuit in addition to the first latch circuit, a bidirectional shift register circuit can be formed by serially connecting only the flip-flop circuits with each other, whereby the bidirectional shift register circuit can be formed without separately providing a switching circuit for switching directions for transferring potentials. Thus, the bidirectional shift register circuit can be formed while suppressing increase of the circuit scale.

In this case, the shift register circuit constituted of the plurality of serially connected flip-flop circuits is preferably formed to be capable of forwardly transferring a prescribed potential input in the output node of either the first inverter circuit or the second inverter circuit from the first-stage flip-flop circuit toward the final-stage flip-flop circuit and reversely transferring the prescribed potential from the final-stage flip-flop circuit toward the first-stage flip-flop circuit. According to this structure, a bidirectional shift register circuit can be easily formed while suppressing increase of the circuit scale.

In the aforementioned shift register circuit constituted of the plurality of serially connected flip-flop circuits, the first latch circuit of each flip-flop circuit constituting the shift register circuit preferably has a function for serving as a sense amplifier determining the levels of the potential of the output node of the first inverter circuit and the potential of the output node of the second inverter circuit and amplifying the difference between the potentials, and the shift register circuit is preferably applied to a memory. According to this structure, each flip-flop circuit can determine data stored in a memory cell through the first latch circuit and amplify the difference between a potential corresponding to the data and a reference potential by inputting the potential corresponding to the data in the output node of either the first inverter circuit or the second inverter circuit of the first latch circuit while inputting the reference potential in the output node of either the second inverter circuit or the first inverter circuit when reading the data stored in the memory cell of the memory. Thus, the first latch circuit of each flip-flop circuit constituting the shift register circuit can also function as a sense amplifier in the memory to which the shift register circuit including the flip-flop circuit is applied, whereby the flip-flop circuit can share the first latch circuit with a sense amplifier. Thus, the circuit scale of the memory to which the shift register circuit including the flip-flop circuit is applied can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The circuit structure of a shift register circuit employing flip-flop circuits according to a first embodiment of the present invention is described with reference to FIG. 1.

Figure 1:
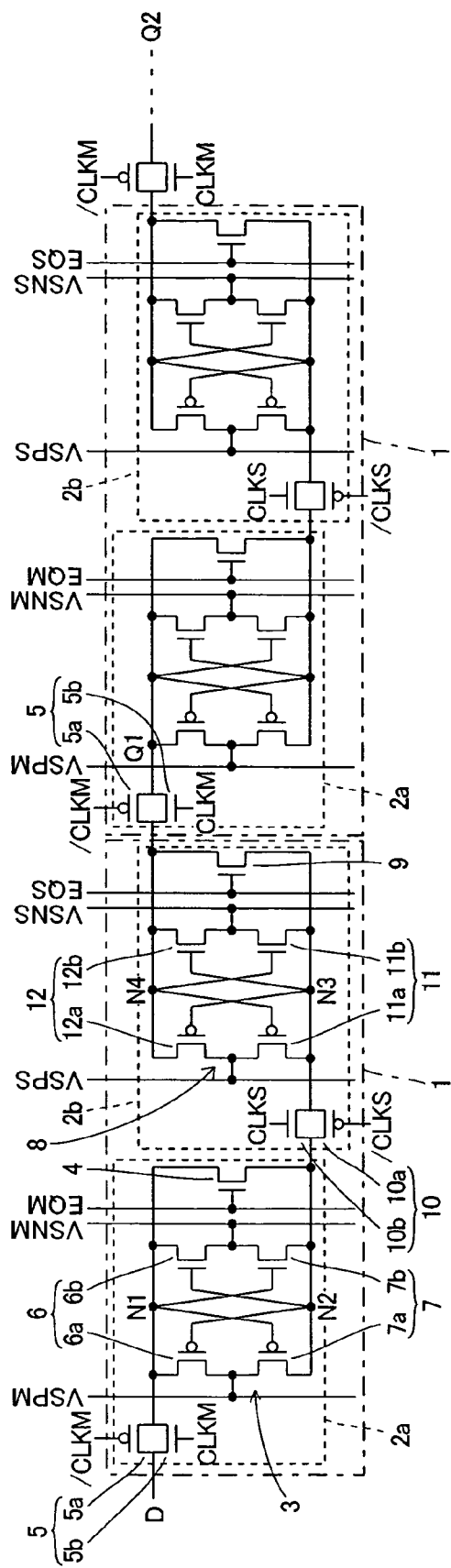
FIG. 1 is a circuit diagram showing the structure of a shift register circuit employing flip-flop circuits according to a first embodiment of the present invention.

As shown in FIG. 1, the shift register circuit is constituted of a plurality of stages of serially connected flip-flop circuits 1 according to the first embodiment. Each of the plurality of stages of flip-flop circuits 1 is constituted of two stages of delay latch circuits 2a and 2b. The delay latch circuits 2a and 2b are examples of the "first latch circuit" and the "second latch circuit" in the present invention respectively. The first-stage delay latch circuit 2a is formed to receive a prescribed input signal from a node D, latch the prescribed input signal for a constant period and thereafter output a signal obtained by inverting the potential of the prescribed input signal to the second-stage delay latch circuit 2b. The second-stage delay latch circuit 2b is formed to receive the output signal from the first-stage delay latch circuit 2a, latch the output signal for a constant period and thereafter output a signal obtained by inverting the potential of the output signal to the subsequent flip-flop circuit 1. The first-stage delay latch circuit 2a is constituted of a latch circuit 3, an n-channel transistor 4 and a transfer gate transistor 5. The n-channel transistor 4 is an example of the "first equalizer circuit" in the present invention.

The latch circuit 3 is constituted of a pair of cross-coupled inverter circuits 6 and 7. The inverter circuits 6 and 7 are examples of the "first inverter circuit" and the "second inverter circuit" in the present invention respectively. The inverter circuit 6 is constituted of a p-channel transistor 6a and an n-channel transistor 6b, and the inverter circuit 7 is constituted of a p-channel transistor 7a and an n-channel transistor 7b. Input terminals (gates of the p-channel transistor 7a and the n-channel transistor 7b) of the inverter circuit 7 are connected to an output node N1 of the inverter circuit 6. Input terminals (gates of the p-channel transistor 6a and the n-channel transistor 6b) of the inverter circuit 6 are connected to an output node N2 of the inverter circuit 7.

According to the first embodiment, two power supply lines supplying power supply voltages VSPM and VSNM switched between potentials Vdd and Vss respectively are connected to the latch circuit 3 of the first-stage delay latch circuit 2a. The power supply line supplying the power supply voltage VSPM is an example of the "first power supply line" or the "first potential supply line" in the present invention, and the power supply line supplying the power supply voltage VSNM is an example of the "first power supply line" or the "second potential supply line" in the present invention. The power supply voltage VSPM is input in the source regions of the p-channel transistors 6a and 7a of the inverter circuits 6 and 7. The power supply voltage VSNM is input in the source regions of the n-channel transistors 6b and 7b of the inverter circuits 6 and 7. When the power supply voltages VSPM and VSNM of the potentials Vdd and Vss are input in the latch circuit 3, the p-channel transistor 6a and the n-channel transistor 7b or the p-channel transistor 7a and the n-channel transistor 6b of the latch circuit 3 enter ON-states. When the p-channel transistor 6a and the n-channel transistor 7b enter ON-states, the gate-to-source voltage Vgs of the p-channel transistor 6a falls below the threshold voltage, and the gate-to-source voltage Vgs of the n-channel transistor 7b exceeds the threshold voltage. When the p-channel transistor 7a and the n-channel transistor 6b enter ON-states, the gate-to-source voltage Vgs of the p-channel transistor 7a falls below the threshold voltage, and the gate-to-source voltage Vgs of the n-channel transistor 6b exceeds the threshold voltage. In this case, the latch circuit 3 is activated, thereby fixing the potentials of the output nodes N1 and N2 of the inverter circuits 6 and 7. When the power supply voltages VSPM and VSNM of the potentials Vss and Vdd are input in the latch circuit 3, on the other hand, all transistors constituting the latch circuit 3 enter OFF-states. In other words, the gate-to-source voltages Vgs of the p-channel transistors 6a and 7a exceed the threshold voltages, and the gate-to-source voltages Vgs of the n-channel transistors 6b and 7b fall below the threshold voltages. In this case, the latch circuit 3 is inactivated, thereby floating the potentials of the output nodes N1 and N2 of the inverter circuits 6 and 7.

Either the source region or the drain region of the n-channel transistor 4 is connected to the output node N1 of the inverter circuit 6, and either the drain region or the source region is connected to the output node N2 of the inverter circuit 7. A control signal EQM is input in the gate of the n-channel transistor 4. According to the first embodiment, the n-channel transistor 4 is responsively turned on when the potential of the control signal EQM rises to the level Vdd, for equalizing the potentials of the output nodes N1 and N2 with each other through the n-channel transistor 4.

The transfer gate transistor 5 is constituted of a p-channel transistor 5a and an n-channel transistor 5b having source and drain regions connected with each other. Either the source region or the drain region of the transfer gate transistor 5 is connected to the node D receiving a prescribed input signal, and either the drain region or the source region is connected to the output node N1 of the inverter circuit 6 of the latch circuit 3. A clock signal CLKM and an inverted clock signal /CLKM are input in the gates of the n-channel transistor 5b and the p-channel transistor 5a of the transfer gate transistor 5 respectively. The transfer gate transistor 5 is switched between ON- and OFF-states in response to the clock signal CLKM and the inverted clock signal /CLKM.

The second-stage delay latch circuit 2b is constituted of a latch circuit 8, an n-channel transistor 9 and a transfer gate transistor 10. The n-channel transistor 9 is an example of the "second equalizer circuit" in the present invention. The latch circuit 8 is constituted of a pair of cross-coupled inverter circuits 11 and 12. The inverter circuits 11 and 12 are examples of the "third inverter circuit" and the "fourth inverter circuit" in the present invention respectively. The inverter circuit 11 is constituted of a p-channel transistor 11a and an n-channel transistor 11b, and the inverter circuit 12 is constituted of a p-channel transistor 12a and an n-channel transistor 12b. Input terminals (gates of the p-channel transistor 12a and the n-channel transistor 12b) of the inverter circuit 12 are connected to an output node N3 of the inverter circuit 11. Input terminals (gates of the p-channel transistor 11a and the n-channel transistor 11b) of the inverter circuit 11 are connected to an output node N4 of the inverter circuit 12.

According to the first embodiment, two power supply lines supplying power supply voltages VSPS and VSNS switched between the potentials Vdd and Vss respectively are connected to the latch circuit 8 of the second-stage delay latch circuit 2b. The power supply line supplying the power supply voltage VSPS is an example of the "second power supply line" or the "third potential supply line" in the present invention, and the power supply line supplying the power supply voltage VSNS is an example of the "second power supply line" or the "fourth potential supply line" in the present invention. The power supply voltages VSPS and VSNS are switched at timing different from that for switching the aforementioned power supply voltages VSPM and VSNM input in the latch circuit 3 of the first-stage delay latch circuit 2a. The power supply voltage VSPS is input in the source regions of the p-channel transistors 11a and 12a of the inverter circuits 11 and 12. The power supply voltage VSNS is input in the source regions of the n-channel transistors 11b and 12b of the inverter circuits 11 and 12. When the power supply voltages VSPS and VSNS of the potentials Vdd and Vss are input in the latch circuit 8, the p-channel transistor 11a and the n-channel transistor 12b or the p-channel transistor 12a and the n-channel transistor 11b of the latch circuit 8 enter ON-states. When the p-channel transistor 11a and the n-channel transistor 12b enter ON-states, the gate-to-source voltage Vgs of the p-channel transistor 11a falls below the threshold voltage, and the gate-to-source voltage Vgs of the n-channel transistor 12b exceeds the threshold voltage. When the p-channel transistor 12a and the n-channel transistor 11b enter ON-states, the gate-to-source voltage Vgs of the p-channel transistor 12a falls below the threshold voltage, and the gate-to-source voltage Vgs of the n-channel transistor 11b exceeds the threshold voltage. In this case, the latch circuit 8 is activated, thereby fixing the potentials of the output nodes N3 and N4 of the inverter circuits 11 and 12. When the power supply voltages VSPS and VSNS of the potentials Vss and Vdd are input in the latch circuit 8, on the other hand, all transistors constituting the latch circuit 8 enter OFF-states. In other words, the gate-to-source voltages Vgs of the p-channel transistors 11a and 12a exceed the threshold voltages, and the gate-to-source voltages Vgs of the n-channel transistors 11b and 12b fall below the threshold voltages. In this case, the latch circuit 8 is inactivated, thereby floating the potentials of the output nodes N3 and N4 of the inverter circuits 11 and 12.

Either the source region or the drain region of the n-channel transistor 9 is connected to the output node N3 of the inverter circuit 11, and either the drain region or the source region is connected to the output node N4 of the inverter circuit 12. A control signal EQS is input in the gate of the n-channel transistor 9. According to the first embodiment, the n-channel transistor 9 is responsively turned on when the potential of the control signal EQS rises to the level Vdd, for equalizing the potentials of the output nodes N3 and N4 with each other through the n-channel transistor 9.

The transfer gate transistor 10 is constituted of a p-channel transistor 10a and an n-channel transistor 10b having source and drain regions connected with each other. Either the source region or the drain region of the transfer gate transistor 10 is connected to the output node N2 of the inverter circuit 7 of the first-stage delay latch circuit 2a, and either the drain region or the source region is connected to the output node N3 of the inverter circuit 11 of the latch circuit 8. A clock signal CLKS and an inverted clock signal /CLKS are input in the gates of the n-channel transistor 10b and the p-channel transistor 10a of the transfer gate transistor 10 respectively. The transfer gate transistor 10 is switched between ON- and OFF-states in response to the clock signal CLKS and the inverted clock signal /CLKS. The clock signal CLKS and the inverted clock signal /CLKS are switched between the potentials Vdd and Vss at timing different from the timing for switching the clock signal CLKM and the inverted clock signal /CLKM input in the gate of the transfer gate transistor 5 of the aforementioned first-stage delay latch circuit 2a.

Each of the second-stage and subsequent flip-flop circuits 1 has a structure similar to that of the aforementioned first-stage flip-flop circuit 1. However, each of the second-stage and subsequent flip-flop circuits 1 receives a signal output from an output node N4 of a second-stage delay latch circuit 2b of the precedent flip-flop circuit 1 in place of the aforementioned prescribed input signal from the node D.

Figure 2:
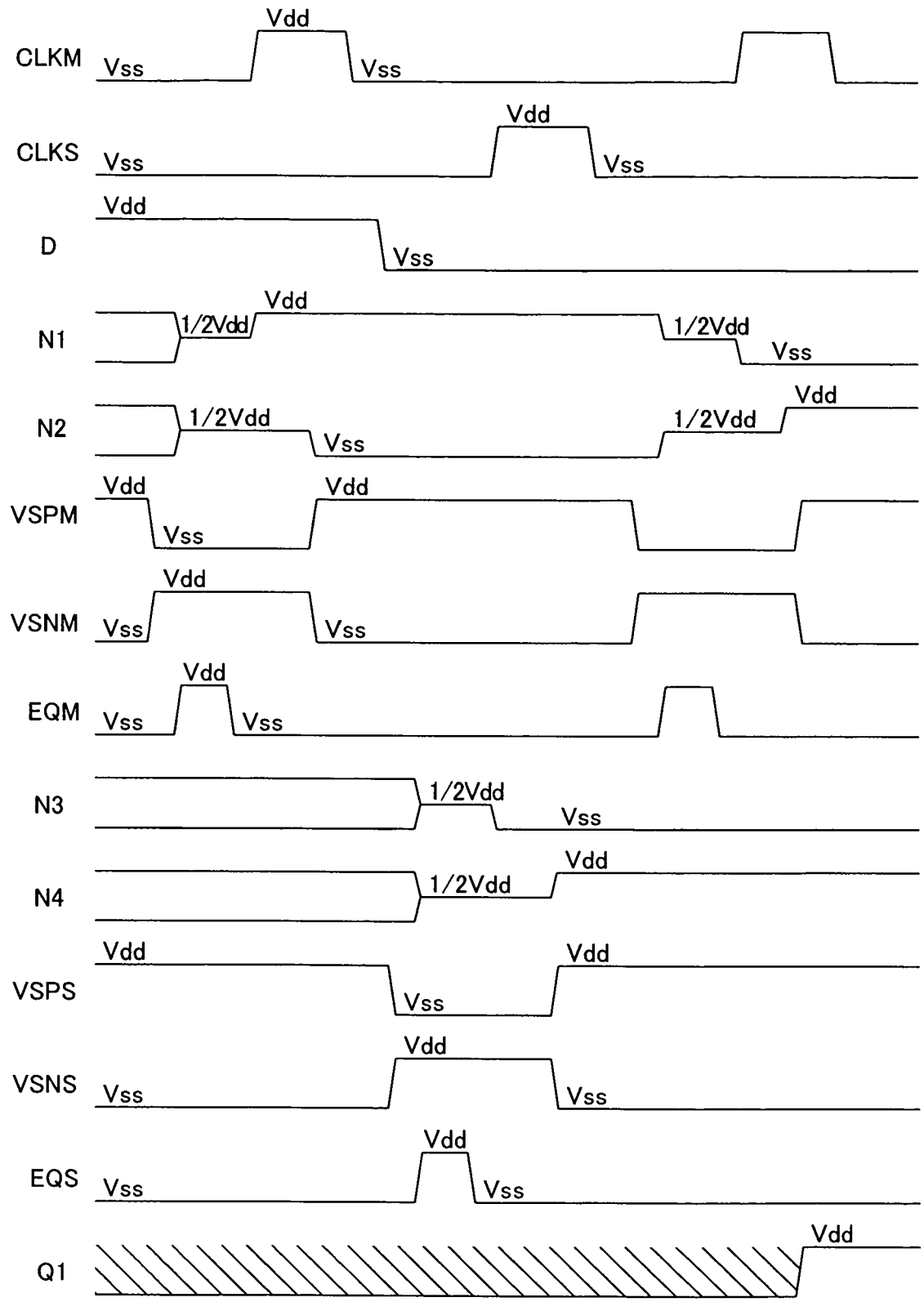
FIGS. 2 and 3 are voltage waveform diagrams for illustrating operations of the shift register circuit employing the flip-flop circuits according to the first embodiment of the present invention.
Figure 3:
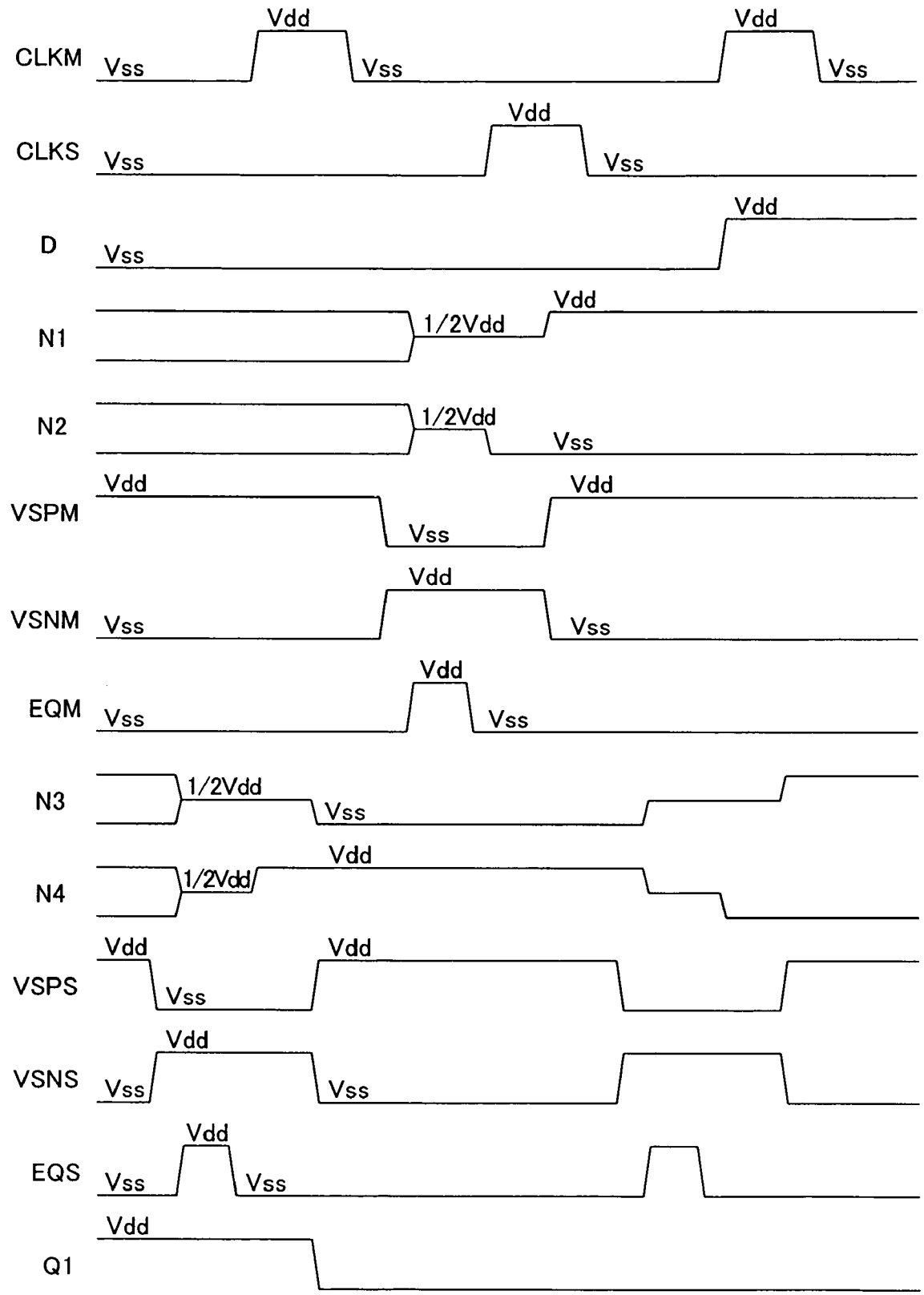

Operations of the shift register circuit employing the flip-flop circuits 1 according to the first embodiment are now described with reference to FIGS. 1 to 3.

An operation of transferring the prescribed input potential received in the node D shown in FIG. 1 toward a node Q2 of the shift register circuit employing the flip-flop circuits 1 (see FIG. 1) according to the first embodiment is described. In this case, the clock signal CLKM and the inverted clock signal /CLKM are at the potentials Vss and Vdd in an initial state, as shown in FIG. 2. Thus, the n-channel transistor 5b and the p-channel transistor 5a of the transfer gate transistor 5 receiving the clock signal CLKM and the inverted clock signal /CLKM in the gates thereof respectively are held in OFF-states in the delay latch circuit 2a of the first-stage flip-flop circuit 1. The clock signal CLKS and the inverted clock signal /CLKS of the potentials Vss an Vdd are input in the gates of the n-channel transistor 10b and the p-channel transistor 10a of the transfer gate transistor 10 of the second-stage delay latch circuit 2b respectively, thereby turning off the transfer gate transistor 10. In the initial state, the node D is at the potential Vdd. Either the output node N1 or the output node N2 of the latch circuit 3 is at the potential Vdd, and either the output node N2 or the output node N1 is at the potential Vss.

According to the first embodiment, the shift register circuit lowers and raises the potentials of the power supply voltages VSPM and VSNM supplied to the latch circuit 3 to the levels Vss and Vdd respectively. Thus, all transistors constituting the latch circuit 3 enter OFF-states through the gate-to-source voltages Vgs thereof. If the potentials of the output nodes N1 and N2 have been at the levels Vdd and Vss respectively in the initial state, the gate-to-source voltage Vgs of the p-channel transistor 7a exceeds the threshold voltage and the gate-to-source voltage Vgs of the n-channel transistor 6b falls below the threshold voltage, thereby turning off the p-channel transistor 7a and the n-channel transistor 6b. The shift register circuit lowers the potential of the power supply voltage VSPM to the level Vss and raises the potential of the power supply voltage VSNM to the level Vdd thereby increasing the gate-to-source voltage Vgs of the p-channel transistor 6a beyond the threshold voltage and reducing the gate-to-source voltage Vgs of the n-channel transistor 7b beyond the threshold voltage, for turning off the p-channel transistor 6a and the n-channel transistor 7b. Thus, all transistors constituting the latch circuit 3 enter OFF-states. If the potentials of the output nodes N1 and N2 have been at the levels Vss and Vdd respectively in the initial state, on the other hand, the gate-to-source voltage Vgs of the p-channel transistor 6a exceeds the threshold voltage and the gate-to-source voltage Vgs of the n-channel transistor 7b falls below the threshold voltage, thereby turning off the p-channel transistor 6a and the n-channel transistor 7b. The shift register circuit lowers the potential of the power supply voltage VSPM to the level Vss and raises the potential of the power supply voltage VSNM to the level Vdd thereby increasing the gate-to-source voltage Vgs of the p-channel transistor 7a beyond the threshold voltage and reducing the gate-to-source voltage Vgs of the n-channel transistor 6b beyond the threshold voltage, for turning off the p-channel transistor 7a and the n-channel transistor 6b. Thus, all transistors constituting the latch circuit 3 enter OFF-states.

As hereinabove described, all transistors constituting the latch circuit 3 enter OFF-states, thereby inactivating the latch circuit 3 and floating the potentials of both of the output nodes N1 and N2 of the inverter circuits 6 and 7 constituting the latch circuit 3. Thereafter the shift register circuit raises the potential of the control signal EQM input in the gate of the n-channel transistor 4 serving as an equalizer circuit to the level Vdd. Thus, the shift register circuit turns on the n-channel transistor 4, thereby equalizing the potentials of the output nodes N1 and N2 of the inverter circuits 6 and 7 with each other through the n-channel transistor 4. In other words, the shift register circuit equalizes both of the potentials of the output nodes N1 and N2 with each other to an intermediate potential ½Vdd between the levels Vdd and Vss since either the output node N1 or the output node N2 has been at the potential Vdd and either the output node N2 or the output node N1 has been at the potential Vss. Thereafter the shift register circuit lowers the potential of the control signal EQM to the level Vss, thereby turning off the n-channel transistor 4.

Then, the shift register circuit raises the potential of the clock signal CLKM to the level Vdd and lowers the potential of the inverted clock signal /CLKM to the level Vss, thereby turning on the transfer gate transistor 5 of the first-stage delay latch circuit 2a. Thus, the shift register circuit inputs the potential Vdd of the node D in the output node N1, having been held in a floating state, of the inverter circuit 6 of the latch circuit 3 through the transfer gate transistor 5. Therefore, the potential of the output node N1 rises from the level ½Vdd to the level Vdd. In this state, the shift register circuit raises and lowers the potentials of the power supply voltages VSPM and VSPS supplied to the latch circuit 3 to the levels Vdd and Vss respectively. Thus, the latch circuit 3 is activated for serving as a sense amplifier. In other words, the gate-to-source voltage Vgs of the p-channel transistor 6a falls below the threshold voltage and the gate-to-source voltage Vgs of the n-channel transistor 7b exceeds the threshold voltage, thereby turning on both of the p-channel transistor 6a and the n-channel transistor 7b and activating the latch circuit 3. At this time, the shift register circuit holds both of the p-channel transistor 7a and the n-channel transistor 6b in OFF-states. Thus, the shift register circuit supplies the power supply voltages VSPM and VSNM of the potentials Vdd and Vss through the p-channel transistor 6a and the n-channel transistor 7b respectively, thereby holding the potential of the output node N1 at the level Vdd and lowering the potential of the output node N2 from the level ½Vdd to the level Vss. Thus, the shift register circuit amplifies the difference between the potentials of the output nodes N1 and N2.

The shift register circuit lowers and raises the potentials of the clock signal CLKM and the inverted clock signal /CLKM input in the gates of the n-channel transistor 5b and the p-channel transistor 5a of the transfer gate transistor 5 to the levels Vss and Vdd respectively. Thus, the shift register circuit turns off the transfer gate transistor 5, thereby holding the potentials (Vdd and Vss) of the output nodes N1 and N2 of the inverter circuits 6 and 7. In the period of the aforementioned operation, the shift register circuit holds the potentials of the clock signal CLKS, the power supply voltage VSNS and the control signal EQS input in the second-stage delay latch circuit 2b at the level Vss, while holding the potentials of the inverted clock signal /CLKS and the power supply voltage VSPS at the level Vdd.

According to the first embodiment, the shift register circuit lowers and raises the potentials of the power supply voltages VSPS and VSNS supplied to the latch circuit 8 of the second-stage delay latch circuit 2b to the levels Vss and Vdd respectively. Thus, all transistors constituting the latch circuit 8 enter OFF-states through the gate-to-source voltages Vgs thereof for inactivating the latch circuit 8, similarly to the aforementioned case of the latch circuit 3 of the first-stage delay latch circuit 2a. Therefore, both of the output nodes N3 and N4 of the inverter circuits 11 and 12 constituting the latch circuit 8 enter floating states. Thereafter the shift register circuit raises the potential of the control signal EQS input in the gate of the n-channel transistor 9 serving as an equalizer circuit to the level Vdd. Thus, the shift register circuit turns on the n-channel transistor 9, thereby equalizing the potentials of the output nodes N3 and N4 of the inverter circuits 11 and 12 with each other through the n-channel transistor 9. Therefore, both of the potentials of the output nodes N3 an N4 reach the level ½Vdd. Thereafter the shift register circuit lowers the potential of the control signal EQS to the level Vss. Thus, the n-channel transistor 9 enters an OFF-state.

Then, the shift register circuit raises the potential of the clock signal CLKS to the level Vdd and lowers the potential of the inverted clock signal /CLKS to the level Vss, thereby turning on the transfer gate transistor 10 of the second-stage delay latch circuit 2b. Thus, the shift register circuit inputs the potential Vss held in the output node N2 of the inverter circuit 7 of the first-stage delay latch circuit 2 in the output node N3, having been held in a floating state, of the latch circuit 8 through the transfer gate transistor 10. Therefore, the potential of the output node N3 falls from the level ½Vdd to the level Vss. In this state, the shift register circuit raises and lowers the potentials of the power supply voltages VSPS and VSNS supplied to the latch circuit 8 to the levels Vdd and Vss respectively. Thus, the latch circuit 8 is activated for serving as a sense amplifier. Therefore, the shift register circuit holds the potential of the output node N3 of the inverter circuit 11 at the level Vss and raises the potential of the output node N4 of the inverter circuit 12 from the level ½Vdd to the level Vdd in the latch circuit 8, thereby amplifying the difference between the potentials of the output nodes N3 and N4.

The shift register circuit lowers and raises the potentials of the clock signal CLKS and the inverted clock signal /CLKS input in the gates of the n-channel transistor 10b and the p-channel transistor 10a of the transfer gate transistor 10 to the levels Vss and Vdd respectively. Thus, the shift register circuit turns off the transfer gate transistor 10, thereby holding the potentials (Vss and Vdd) of the output nodes N3 and N4 of the inverter circuits 11 and 12. In the period of the aforementioned operation, the shift register circuit holds the potentials of the clock signal CLKM, the power supply voltage VSNM and the control signal EQM input in the first-stage delay latch circuit 2a of the second-stage flip-flop circuit 1 at the level Vss, while holding the potentials of the inverted clock signal /CLKM and the power supply voltage VSPM at the level Vdd. Thereafter the shift register circuit raises the potential of the clock signal CLKM to the level Vdd and lowers the potential of the inverted clock signal /CLKM to the level Vss, thereby turning on the transfer gate transistor 5 of the first-stage delay latch circuit 2a of the second-stage flip-flop circuit 1. Thus, the shift register circuit inputs the potential Vdd held in the output node N4 of the first-stage flip-flop circuit 1 in the node Q1 of the first-stage delay latch circuit 2a of the second-stage flip-flop circuit 1 through the transfer gate transistor 5.

The shift register circuit performs an operation similar to the above in each flip-flop circuit 1, thereby alternately raising the potentials of the clock signals CLKM and CLKS to the level Vdd and responsively sequentially transferring the prescribed potential input in the node D toward the node Q2 (see FIG. 1) while shifting timing.

An operation of transferring the potential of the node Q1 toward the node D is now described. In other words, an operation of transferring the potential reversely to the aforementioned case of transferring the potential from the node D toward the node Q2 is described. In this case, the clock signal CLKM and the inverted clock signal /CLKM are at the potentials Vss and Vdd respectively, as shown in FIG. 3. Thus, the transfer gate transistor 5 of the delay latch circuit 2a of the second-stage flip-flop circuit 1 (see FIG. 1) is in an OFF-state. The clock signal CLKS and the inverted clock signal /CLKS are at the potentials Vss and Vdd respectively. Thus, the transfer gate transistor 10 of the first-stage flip-flop circuit 1 is in an OFF-state. The potential of the node Q1 is at the level Vdd. In the latch circuit 8, either the output node N3 or the output node N4 is at the potential Vdd, while either the output node N4 or the output node N3 is at the potential Vss.

According to the first embodiment, the shift register circuit lowers and raises the potentials of the power supply voltages VSPS and VSNS supplied to the latch circuit 8 to the levels Vss and Vdd respectively. Thus, both of the output nodes N3 an N4 of the inverter circuits 11 and 12 constituting the latch circuit 8 enter floating states. Thereafter the shift register circuit raises the potential of the control signal EQS input in the gate of the n-channel transistor 9 serving as an equalizer circuit to the level Vdd. Thus, the shift register circuit turns on the n-channel transistor 9, thereby equalizing the potential (Vdd or Vss) of the output node N3 of the inverter circuit 11 and the potential (Vss or Vdd) of the output node N4 of the inverter circuit 12 with each other to the level ½Vdd through the n-channel transistor 9. Thereafter the shift register circuit lowers the potential of the control signal EQS to the level Vss. Thus, the n-channel transistor 9 enters an OFF-state.

Then, the shift register circuit raises the potential of the clock signal CLKM to the level Vdd and lowers the potential of the inverted clock signal /CLKM to the level Vss, thereby turning on the transfer gate transistor 5 of the second-stage flip-flop circuit 1. Thus, the shift register circuit inputs the potential Vdd of the node Q1 in the floating output node N4 of the inverter circuit 12 of the latch circuit 8 through the transfer gate transistor 5. Therefore, the potential of the output node N4 rises from the level ½Vdd to the level Vdd. In this state, the shift register circuit raises and lowers the potentials of the power supply voltages VSPS and VSNS supplied to the latch circuit 8 to the levels Vdd and Vss respectively. Thus, the latch circuit 8 is activated for serving as a sense amplifier. Therefore, the shift register circuit holds the output node N4 of the inverter circuit 12 at the potential Vdd and lowers the potential of the output node N3 of the inverter circuit 11 from the level ½Vdd to the level Vss, thereby amplifying the difference between the potentials of the output nodes N3 and N4.

The shift register circuit lowers the potential of the clock signal CLKM to the level Vss, and raises the potential of the inverted clock signal /CLKM to the level Vdd. Thus, the shift register circuit turns off the transfer gate transistor 5 of the second-stage flip-flop circuit 1, thereby holding the potentials (Vdd and Vss) of the output nodes N4 and N3 of the inverter circuits 12 and 11. In the period of the aforementioned operation, the shift register circuit holds the potentials of the clock signal CLKS and the inverted clock signal /CLKS at the levels Vss and Vdd respectively. Thus, the shift register circuit holds the transfer gate transistor 10 of the first-stage flip-flop circuit 1 in an OFF-state. In the period of the aforementioned operation, the shift register circuit holds the potentials of the power supply voltage VSNM and the control signal EQM at the level Vss, while holding the potential of the power supply voltage VSPM at the level Vdd. Further, the shift register circuit holds the potential of either the output node N1 or the output node N2 at the level Vdd while holding the potential of either the output node N2 or the output node N1 at the level Vss in the latch circuit 3 of the first-stage flip-flop circuit 1.

According to the first embodiment, the shift register circuit lowers and raises the potentials of the power supply voltages VSPM and VSNM supplied to the latch circuit 3 of the first-stage flip-flop circuit 1 to the levels Vss and Vdd respectively. Thus, both of the output nodes N1 and N2 of the inverter circuits 6 and 7 constituting the latch circuit 3 enter floating states. Thereafter the shift register circuit raises the potential of the control signal EQM input in the gate of the n-channel transistor 4 serving as an equalizer circuit to the level Vdd. Thus, the shift register circuit turns on the n-channel transistor 4, thereby equalizing the potential (Vdd or Vss) of the output node N1 of the inverter circuit 6 and the potential (Vss or Vdd) of the output node N2 of the inverter circuit 7 with each other to the level ½Vdd through the n-channel transistor 4. Thereafter the shift register circuit lowers the potential of the control signal EQM to the level Vss. Thus, the n-channel transistor 4 enters an OFF-state.

Then, the shift register circuit raises the potential of the clock signal CLKS to the level Vdd and lowers the potential of the inverted clock signal /CLKS to the level Vss, thereby turning on the transfer gate transistor 10. Thus, the shift register circuit inputs the potential Vss held in the output node N3 of the inverter circuit 11 of the latch circuit 8 in the floating output node N2 of the latch circuit 3 through the transfer gate transistor 10. Therefore, the potential of the output node N2 lowers from the level ½Vdd to the level Vss. In this state, the shift register circuit raises and lowers the potentials of the power supply voltages VSPM and VSNM supplied to the latch circuit 3 to the levels Vdd and Vss respectively. Thus, the latch circuit 3 is activated for serving as a sense amplifier. Therefore, the shift register circuit holds the output node N2 of the inverter circuit 7 of the latch circuit 3 at the potential Vss and raises the potential of the output node N1 of the inverter circuit 6 from the level ½Vdd to the level Vdd, thereby amplifying the difference between the potentials of the output nodes N1 and N2.

The shift register circuit lowers the potential of the clock signal CLKS to the level Vss, and raises the potential of the inverted clock signal /CLKS to the level Vdd. Thus, the shift register circuit turns on the transfer gate transistor 10, thereby holding the potentials (Vdd and Vss) of the output nodes N1 and N2 of the inverter circuits 6 and 7. In the period of the aforementioned operation of introducing the potential of the output node N3 of the latch circuit 8 into the latch circuit 3, the shift register circuit holds the potentials of the clock signal CLKM and the inverted clock signal /CLKM at the levels Vss and Vdd respectively. Thus, the shift register circuit holds the transfer gate transistor 5 of the first-stage flip-flop circuit 1 in an OFF-state.

Thereafter the shift register circuit raises the potential of the clock signal CLKM to the level Vdd and lowers the potential of the inverted clock signal /CLKM to the level Vss, thereby turning on the transfer gate transistor 5 of the first-stage flip-flop circuit 1. Thus, the shift register circuit inputs the potential Vdd held in the output node N1 of the latch circuit 7 in the node D through the transfer gate transistor 5. The shift register circuit transfers the potential of the node Q1 to the node D in the aforementioned manner. According to the first embodiment, the shift register circuit performs an operation similar to the above in each flip-flop circuit 1 in order to transfer the potential from the node Q2 toward the node D.

According to the first embodiment, as hereinabove described, all transistors constituting the latch circuit 3 (8) enter OFF-states for inactivating the latch circuit 3 (8) when the shift register circuit sets the potentials of the power supply voltages VSPM and VSNM (VSPS and VSNS) supplied to the latch circuit 3 (8) to the levels Vss and Vdd respectively before inputting the prescribed potential in the output node N1 (N3) of the inverter circuit 6 (11) of the latch circuit 3 (8) by supplying the power supply voltages VSPM and VSNM (VSPS and VSNS) switchable between the potentials Vdd and Vss in the latch circuit 3 (8) of the delay latch circuit 2a (2b), whereby the shift register circuit can float the potential of the output node N1 (N3) of the inverter circuit 6 (11) constituting the latch circuit 3 (8). Thus, the shift register circuit can inhibit the prescribed input potential and the potential of the output node N1 (N3) of the inverter circuit 6 (11) from colliding with each other. Therefore, the shift register circuit, capable of suppressing increase of current consumption resulting from collision of the prescribed input potential and the potential of the output node N1 (N3) of the inverter circuit 6 (11), can inhibit each flip-flop circuit 1 from increase of current consumption.

According to the first embodiment, the shift register circuit, capable of floating the potential of the output node N1 (N3) of the inverter circuit 6 (11) constituting the latch circuit 3 (8) by setting the potentials of the power supply voltages VSPM and VSNM (VSPS and VSNS) supplied to the latch circuit 3 (8) to the levels Vss and Vdd respectively as hereinabove described, can inhibit the prescribed input potential and the potential of the output node N1 (N3) of the inverter circuit 6 (11) of the latch circuit 3 (8) from colliding with each other. Thus, the shift register circuit may be provided with no transistor for inhibiting the output potential of the inverter circuit 6 (11) from transmission to the node receiving the prescribed potential in order to suppress the collision. Therefore, the shift register circuit can inhibit each flip-flop circuit 1 from increase of the circuit scale while suppressing increase of current consumption.

According to the first embodiment, the shift register circuit, equalizing the potentials of the output nodes N1 and N2 (N3 and N4) of the inverter circuits 6 and 7 (11 and 12) with each other to the level ½Vdd through the n-channel transistor 4 (9) serving as an equalizer circuit, can inhibit the potential Vdd (Vss) thereafter input in the output node N1 (N3) of the inverter circuit 6 (11) and the potential (½Vdd) of the output node N2 (N4) of the inverter circuit 7 (12) from reaching the same level. Thus, the shift register circuit can avoid difficulty in determining whether the potential of the output node N1 (N3) of the inverter circuit 6 (11) receiving the potential Vdd or Vss is higher or lower than the potential of the output node N2 (N4) of the inverter circuit 7 (12) in the latch circuit 3 (8).

According to the first embodiment, the shift register circuit supplies the power supply voltages VSPM and VSNM of the potentials Vdd and Vss to the first-stage delay latch circuit 2a while supplying the power supply voltages VSPS and VSNS of the potentials Vss and Vdd to the second-stage delay latch circuit 2b, thereby turning on either the p-channel transistor 6a or the n-channel transistor 7b or either the p-channel transistor 7a or the n-channel transistor 6b constituting the latch circuit 3 of the first-stage delay latch circuit 2a and activating the latch circuit 3 while turning off all transistors constituting the latch circuit 8 of the second-stage delay latch circuit 2b and inactivating the latch circuit 8 through the gate-to-source voltages Vgs of the transistors. Thus, the shift register circuit can fix the potentials of the output nodes N1 and N2 of the inverter circuits 6 and 7 constituting the latch circuit 3 in the first-stage delay latch circuit 2a and float the potentials of the output nodes N3 and N4 of the inverter circuits 11 and 12 constituting the latch circuit 8 in the second-stage delay latch circuit 2b. Thereafter the shift register circuit can float the potentials of both of the output nodes N3 and N4 of the inverter circuits 11 and 12 with the potential ½Vdd by equalizing the potentials of the output nodes N3 and N4 of the inverter circuits 11 and 12 of the second-stage delay latch circuit 2b with each other to the level ½Vdd through the n-channel transistor 9. Further, the shift register circuit can transfer the fixed potential of the output node N2 of the inverter circuit 7 of the first-stage delay latch circuit 2a to the floating output node N3 of the inverter circuit 11 of the second-stage delay latch circuit 2b by turning on the transfer gate transistor 10 in response to the clock signal CLKS (inverted clock signal /CLKS). In addition, the shift register circuit can determine whether the potential transferred from the first-stage delay latch circuit 2a is higher or lower than the potential ½Vdd of the output node N4 of the inverter circuit 12 and thereafter fix the same to the level Vdd or Vss by raising and lowering the potentials of the power supply voltages VSPS and VSNS supplied to the second-stage delay latch circuit 2b to the levels Vdd and Vss respectively. The shift register circuit can sequentially transfer the potential input from the node D toward the node Q2 by performing an operation similar to the above in each flip-flop circuit 1.

According to the first embodiment, the shift register circuit supplies the power supply voltages VSPS and VSNS of the potentials Vdd and Vss to the second-stage delay latch circuit 2b and supplies the power supply voltages VSPM and VSNM of the potentials Vss and Vdd to the first-stage delay latch circuit 2a, thereby turning on either the p-channel transistor 11a or the n-channel transistor 12b or either the p-channel transistor 12a or the n-channel transistor 11b constituting the latch circuit 8 of the second-stage delay latch circuit 2b and activating the latch circuit 8 while turning off all transistors constituting the latch circuit 3 of the first-stage delay latch circuit 2a and inactivating the latch circuit 3 through the gate-to-source voltages Vgs of the transistors. Thus, the shift register circuit can fix the potentials of the output nodes N3 an N4 of the inverter circuits 11 and 12 constituting the latch circuit 8 in the second-stage delay latch circuit 2b and float the potentials of the output nodes N1 and N2 of the inverter circuits 6 and 7 constituting the latch circuit 3 in the first-stage delay latch circuit 2a. Thereafter the shift register can float the potentials of both of the output nodes N1 and N2 of the inverter circuits 6 and 7 with the potential ½Vdd in the first-stage delay latch circuit 2a by equalizing the potentials of the output nodes N1 and N2 of the inverter circuits 6 and 7 of the first-stage delay latch circuit 2a with each other to the level ½Vdd through the n-channel transistor 4. Further, the shift register circuit can transfer the fixed potential of the output node N3 of the inverter circuit 11 of the second-stage delay latch circuit 2b to the floating output node N2 of the inverter circuit 7 of the first-stage delay latch circuit 2a by turning on the transfer gate transistor 10 in response to the clock signal CLKS (inverted clock signal /CLKS). In addition, the shift register circuit can determine whether the potential transferred from the second-stage delay latch circuit 2b is higher or lower than the potential ½Vdd of the output node N1 of the inverter circuit 6 and fix the same to the level Vdd or Vss by raising and lowering the potentials of the power supply voltages VSPM and VSNM supplied to the first-stage delay latch circuit 2a to the levels Vdd and Vss respectively. The shift register circuit can sequentially transfer the prescribed potential from the node Q2 toward the node D by performing an operation similar to the above in each flip-flop circuit 1. As hereinabove described, the shift register circuit employing the flip-flop circuits 1 according to the first embodiment can bidirectionally transfer potentials from the node D toward the node Q2 and vice versa.

Figure 4:
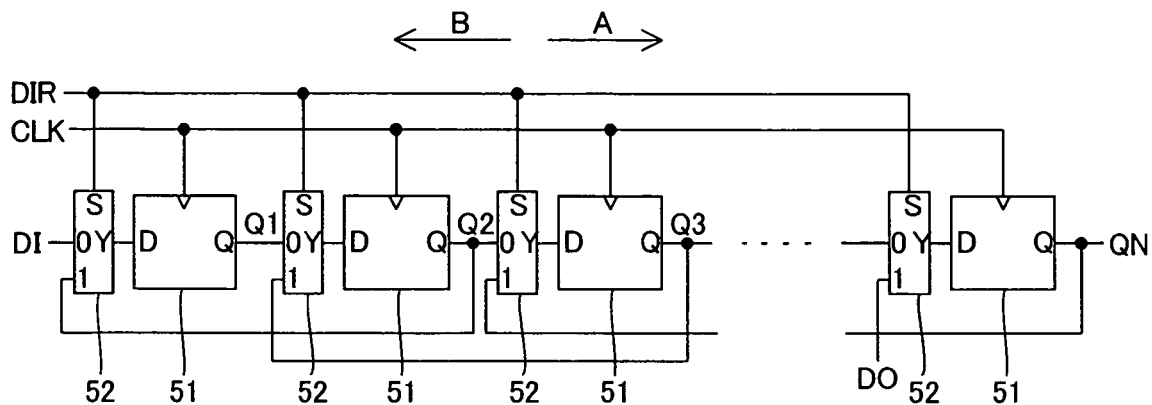
FIG. 4 is a block diagram showing the structure of a bidirectional shift register circuit employing flip-flop circuits according to comparative example of the first embodiment of the present invention.

FIG. 4 shows the structure of a bidirectional shift register circuit including flip-flop circuits 51 according to comparative example of the first embodiment. The comparative bidirectional shift register circuit shown in FIG. 4 is formed by serially connecting each flip-flop circuit 51 with a switching circuit 52 and serially connecting a plurality of sets of the flip-flop circuits 51 and the switching circuits 52 with each other. A node D of each flip-flop circuit 51 receives a potential output from a node Q of the precedent or subsequent flip-flop circuit 51 through the corresponding switching circuit 52. A clock signal CLK is input in each flip-flop circuit 51. When the potential of the clock signal CLK rises to a level Vdd, the flip-flop circuit 51 responsively outputs an output potential corresponding to the potential received in the node D.

"0" and "1" input terminals of each switching circuit 52 receive the output potentials from the precedent and subsequent flip-flop circuits 51 respectively. A transfer direction set signal DIR is input in an input terminal S of each switching circuit 52. This transfer direction set signal DIR controls the switching circuit 52 as to whether to output the output potential of the precedent flip-flop circuit 51 received in the "0" input terminal or to output the output potential of the subsequent flip-flop circuit 51 received in the "1" input terminal from its output terminal Y.

Figure 5:
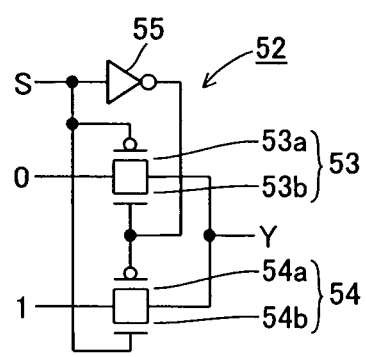
FIG. 5 is a circuit diagram showing the structure of a switching circuit of the bidirectional shift register circuit employing the comparative flip-flop circuits shown in FIG. 4.

As shown in FIG. 5, each switching circuit 52 is constituted of two transfer gate transistors 53 and 54 and an inverter circuit 55. The transfer gate transistor 53 is constituted of a p-channel transistor 53a and an n-channel transistor 53b. The transfer gate transistor 54 is constituted of a p-channel transistor 54a and an n-channel transistor 54b. Either the source region or the drain region of the transfer gate transistor 53 is connected to the "0" input terminal, and either the drain region or the source region is connected to the output terminal Y. The gate of the p-channel transistor 53a of the transfer gate transistor 53 is connected to the input terminal S. Either the source region or the drain region of the transfer gate transistor 54 is connected to the "1" input terminal, and either the drain region or the source region is connected to the output terminal Y. The gate of the n-channel transistor 54b of the transfer gate transistor 54 is connected to the input terminal S. An output terminal of the inverter circuit 55 is connected to the gates of the n-channel transistor 53b of the transfer gate transistor 53 and the p-channel transistor 54a of the transfer gate transistor 54. An input terminal of the inverter circuit 55 is connected to the input terminal S.

Figure 6:
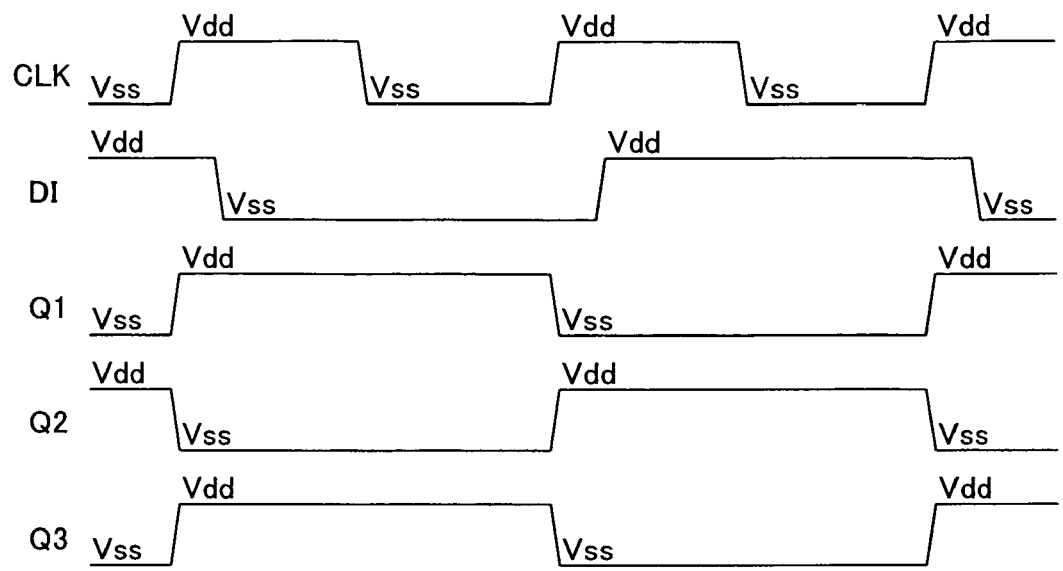
FIGS. 6 and 7 are voltage waveform diagrams for illustrating operations of the comparative bidirectional shift register circuit shown in FIG. 4.
Figure 7:
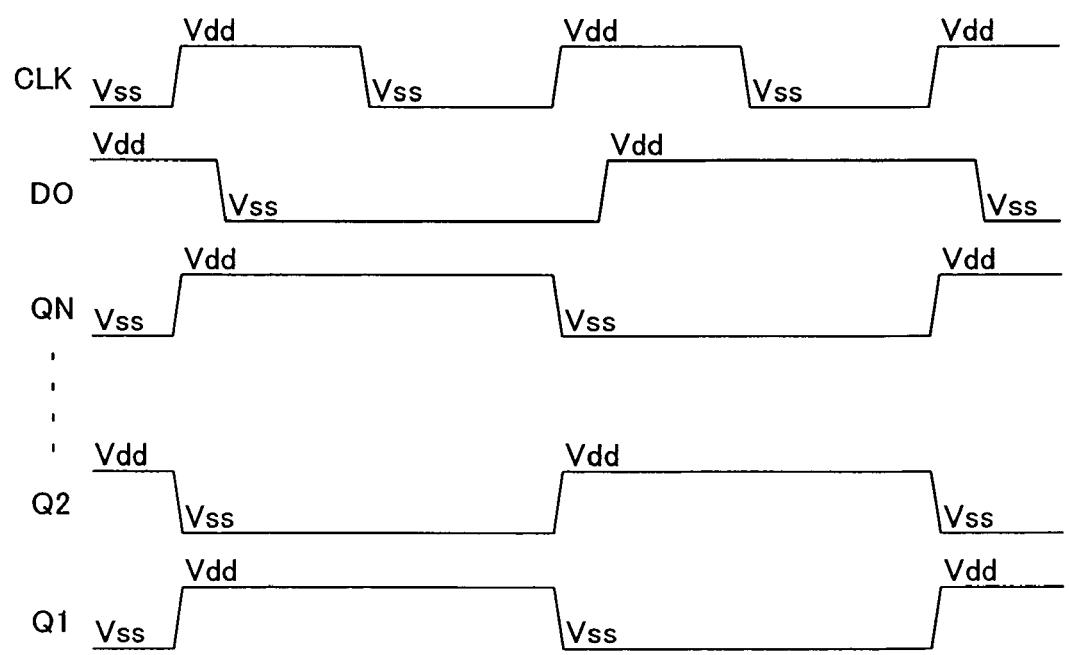

FIGS. 6 and 7 are voltage waveform diagrams for illustrating operations of the comparative bidirectional shift register circuit shown in FIG. 4. In order to transfer a potential input in a node DI in a direction A shown in FIG. 4, the comparative bidirectional shift register circuit shown in FIG. 4 inputs the transfer direction set signal DIR of a potential Vss in the input terminal S of each switching circuit 52. Thus, the gates of the p-channel transistor 53a and the n-channel transistor 53b of the transfer gate transistor 53 receive the potentials Vss and Vdd respectively in the switching circuit 52 (see FIG. 5). Therefore, the transfer gate transistor 53 enters an ON-state. On the other hand, the gates of the p-channel transistor 53a and the n-channel transistor 54b of the transfer gate transistor 54 receive the potentials Vdd and Vss respectively. Therefore, the transfer gate transistor 54 enters an OFF-state. Thus, the switching circuit 52 outputs the output potential of the precedent flip-flop circuit 51 received in the "0" input terminal from the output terminal Y through the transfer gate transistor 53.

Thus, the first-stage flip-flop circuit 51 receives the input potential (Vdd) from the node DI through the first-stage switching circuit 52. When the clock signal CLK rises from the level Vss to the level Vdd, therefore, a potential Q1 output from the first-stage flip-flop circuit 51 also rises from the level Vss to the level Vdd, as shown in FIG. 6. The output potential Q1 of the level Vdd is input in the second-stage flip-flop circuit 51 through the second-stage switching circuit 52. When the potential of the clock signal CLK thereafter rises to the level Vdd again, therefore, a potential Q2 output from the second-stage flip-flop circuit 51 also rises from the level Vss to the level Vdd. When the potential of the clock signal CLK subsequently rises to the level Vdd, an output potential Q3 from the third-stage flip-flop circuit 51 also rises to the level Vdd. Thus, the bidirectional shift register circuit sequentially transfers the potential input from the node DI in the direction A shown in FIG. 4 every time the potential of the clock signal $\overline{\text{CLK}}$ rises to the level Vdd.

In order to transfer a potential input from a node DO in a direction B in FIG. 4, on the other hand, the bidirectional shift register circuit inputs the transfer direction set signal DIR of the potential Vdd in the input terminal S of each switching circuit 52. Thus, the gates of the p-channel transistor 53a and the n-channel transistor 53b of the transfer gate transistor 53 receive the potentials Vdd and Vss respectively in the switching circuit 52 (see FIG. 5). Therefore, the transfer gate transistor 53 enters an OFF-state. On the other hand, the gates of the p-channel transistor 54a and the n-channel transistor 54b of the transfer gate transistor 54 receive the potentials Vss and Vdd respectively. Therefore, the transfer gate transistor 54 enters an ON-state. Thus, the switching circuit 52 outputs the output potential of the subsequent flip-flop circuit 51 received in the "1" input terminal from the output terminal Y through the transfer gate transistor 54.

Therefore, the $N^{th}$-stage flip-flop circuit 51 receives the input potential (Vdd) from the node DO through the $N^{th}$-stage switching circuit 52. When the clock signal CLK rises from the level Vss to the level Vdd, therefore, a potential QN output from the $N^{th}$-stage flip-flop circuit 51 also rises from the level Vss to the level Vdd. The output potential QN of the level Vdd is input in the $(N-1)^{th}$-stage flip-flop circuit 51 through the $(N-1)^{th}$ stage switching circuit 52. When the potential of the clock signal CLK thereafter rises to the level Vdd again, therefore, a potential (QN-1) output from the $(N-1)^{th}$-stage flip-flop circuit 51 also rises from the level Vss to the level Vdd. Thereafter the bidirectional shift register circuit sequentially transfers the potential input from the node DO in the direction B in FIG. 4 through an operation similar to the above every time the potential of the clock signal CLK rises to the level Vdd.

The comparative shift register circuit shown in FIG. 4 can bidirectionally transfer potentials in the aforementioned manner. In the comparative bidirectional shift register circuit shown in FIG. 4, however, the switching circuits 52 for switching the directions for transferring potentials are provided between the flip-flop circuits 51. Therefore, the circuit scale of the shift register circuit is disadvantageously increased. On the other hand, the shift register circuit according to the first embodiment shown in FIG. 1, formed to be capable of bidirectionally transferring potentials by serially connecting only the plurality of flip-flop circuits 1 with each other, can be inhibited from increase of the circuit scale dissimilarly to the comparative shift register circuit shown in FIG. 4.

Second Embodiment

The structure of a DRAM employing a shift register circuit including flip-flop circuits according to a second embodiment of the present invention is now described with reference to FIG. 8.

Figure 8:
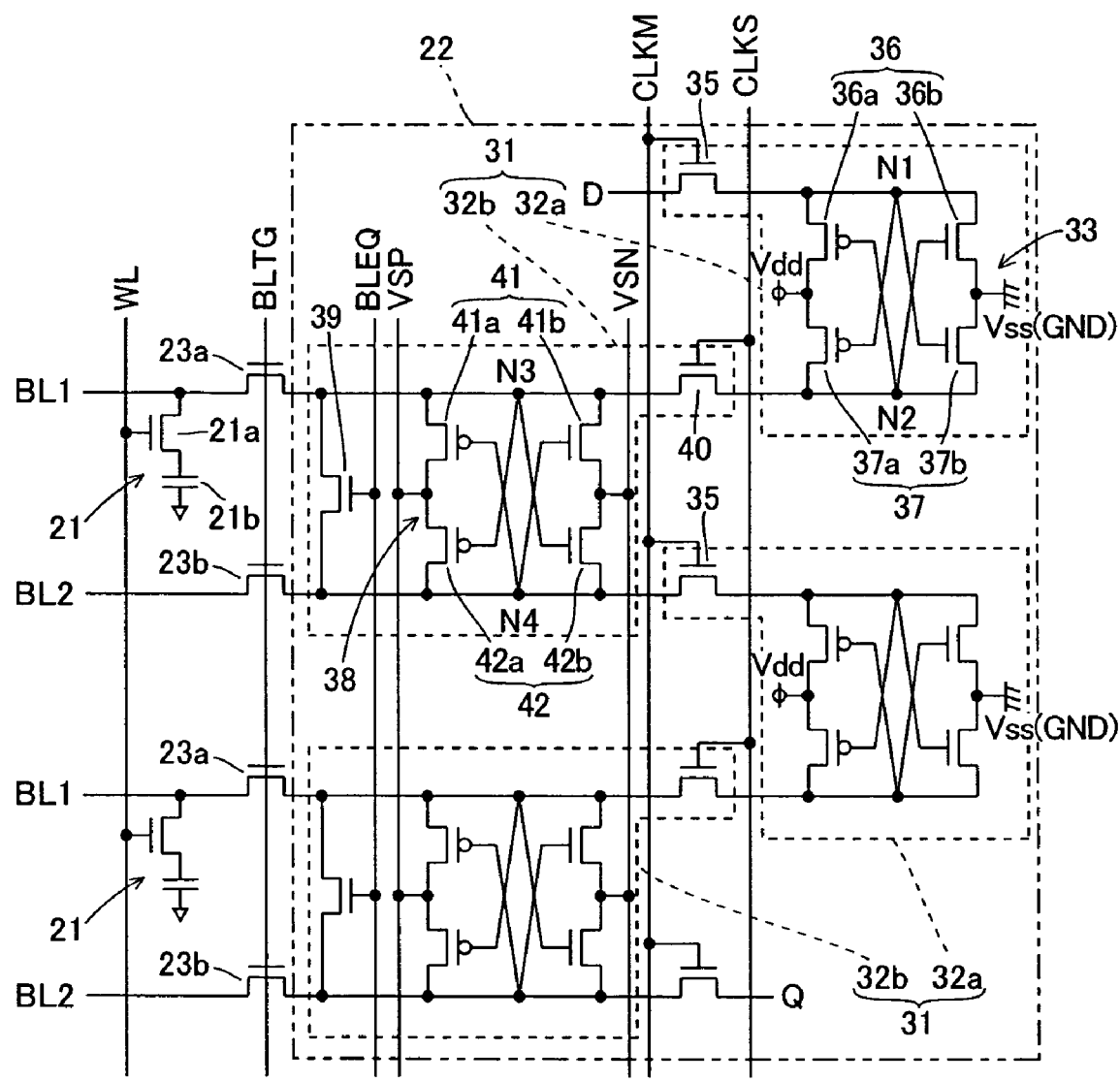
FIG. 8 is a circuit diagram showing the structure of a DRAM employing a shift register circuit including flip-flop circuits according to a second embodiment of the present invention.

As shown in FIG. 8, the DRAM according to the second embodiment includes memory cells 21 provided on positions where a word line WL and bit lines BL1 intersect with each other, a shift register circuit 22 and n-channel transistors 23a and 23b. Each memory cell 21 is constituted of an n-channel transistor 21a and a capacitor 21b. Either the source region or the drain region of the n-channel transistor 21a is connected to the corresponding bit line BL1, and either the drain region or the source region is connected to the capacitor 21. The gate of the n-channel transistor 21a is connected to the word line WL. The capacitor 21b holds charges responsive to data stored in the memory cell 21. In each of the n-channel transistors 23a and 23b, either the source region or the drain region is connected to the corresponding bit line BL1 and another corresponding bit line BL2, and either the drain region or the source region is connected to the shift register circuit 22.

The shift register circuit 22 is constituted of a plurality of serially connected flip-flop circuits 31. The first-stage flip-flop circuit 31 closer to a node D shown in FIG. 8 is constituted of a first-stage delay latch circuit 32a and a second-stage delay latch circuit 32b. The second-stage delay latch circuit 32b is an example of the "first latch circuit" in the present invention. The first-stage delay latch circuit 32a is constituted of a latch circuit 33 and a transfer gate transistor 35 formed by an n-channel transistor. The latch circuit 33 is formed by cross-coupling an inverter circuit 36 formed by a p-channel transistor 36a and an n-channel transistor 36b and an inverter circuit 37 formed by a p-channel transistor 37a and an n-channel transistor 37b with each other. This latch circuit 33 is supplied with power supply voltages fixed to potentials Vdd and Vss respectively. In other words, the source regions of the p-channel transistors 36a and 37a of the inverter circuits 36 and 37 are supplied with the power supply voltage of the potential Vdd. Further, the source regions of the n-channel transistors 36b and 37b of the inverter circuits 36 and 37 are supplied with the power supply voltage of the potential Vss (GND). The remaining structure of the first-stage delay latch circuit 32a according to the second embodiment is similar to that of the first-stage delay latch circuit 2a according to the first embodiment shown in FIG. 1.

The second-stage delay latch circuit 32b is constituted of a latch circuit 38, an n-channel transistor 39 and a transfer gate transistor 40 formed by an n-channel transistor. The n-channel transistor 39 is an example of the "first equalizer circuit" in the present invention. The latch circuit 38 is formed by cross-coupling an inverter circuit 41 formed by a p-channel transistor 41a and an n-channel transistor 41b and an inverter circuit 42 formed by a p-channel transistor 42a and an n-channel transistor 42b with each other. The inverter circuit 41 is an example of the "first inverter circuit" in the present invention, and the inverter circuit 42 is an example of the "second inverter circuit" in the present invention. The remaining structure of the second-stage delay latch circuit 32b according to the second embodiment is similar to that of the second-stage delay latch circuit 2b according to the first embodiment shown in FIG. 1.

According to the second embodiment, the aforementioned second-stage delay latch circuit 32b has a function for serving as a sense amplifier determining the potential of data read from the corresponding memory cell 21 and amplifying the same. In other words, the bit line BL1 linked with the corresponding memory cell 21 is connected to an output node N3 of the inverter circuit 41 of the second-stage delay latch circuit 32b through the n-channel transistor 23a. The corresponding bit line BL2 is connected to an output node N4 of the inverter circuit 42 of the second-stage delay latch circuit 32b through the n-channel transistor 23b. Thus, the DRAM inputs the potential corresponding to the data held in the corresponding memory cell 21 in the output node N3 of the inverter circuit 41 of the second-stage delay latch circuit 32b through the corresponding bit line BL1 and the n-channel transistor 23a when reading the data from the memory cell 21. Further, the DRAM inputs a reference potential in the output node N4 of the inverter circuit 42 through the corresponding bit line BL2 and the n-channel transistor 23b. Thus, the second-stage delay latch circuit 32b compares the potential of the output node N3 and the reference potential of the output node N4 with each other for determining the data and amplifying the difference between the potentials. The subsequent flip-flop circuits 31 are similar in structure to the aforementioned first-stage flip-flop circuit 31.

Data read and rewrite operations of the DRAM employing the shift register circuit 22 including the flip-flop circuits 31 according to the second embodiment are now described with reference to FIGS. 8 and 9.

Figure 9:
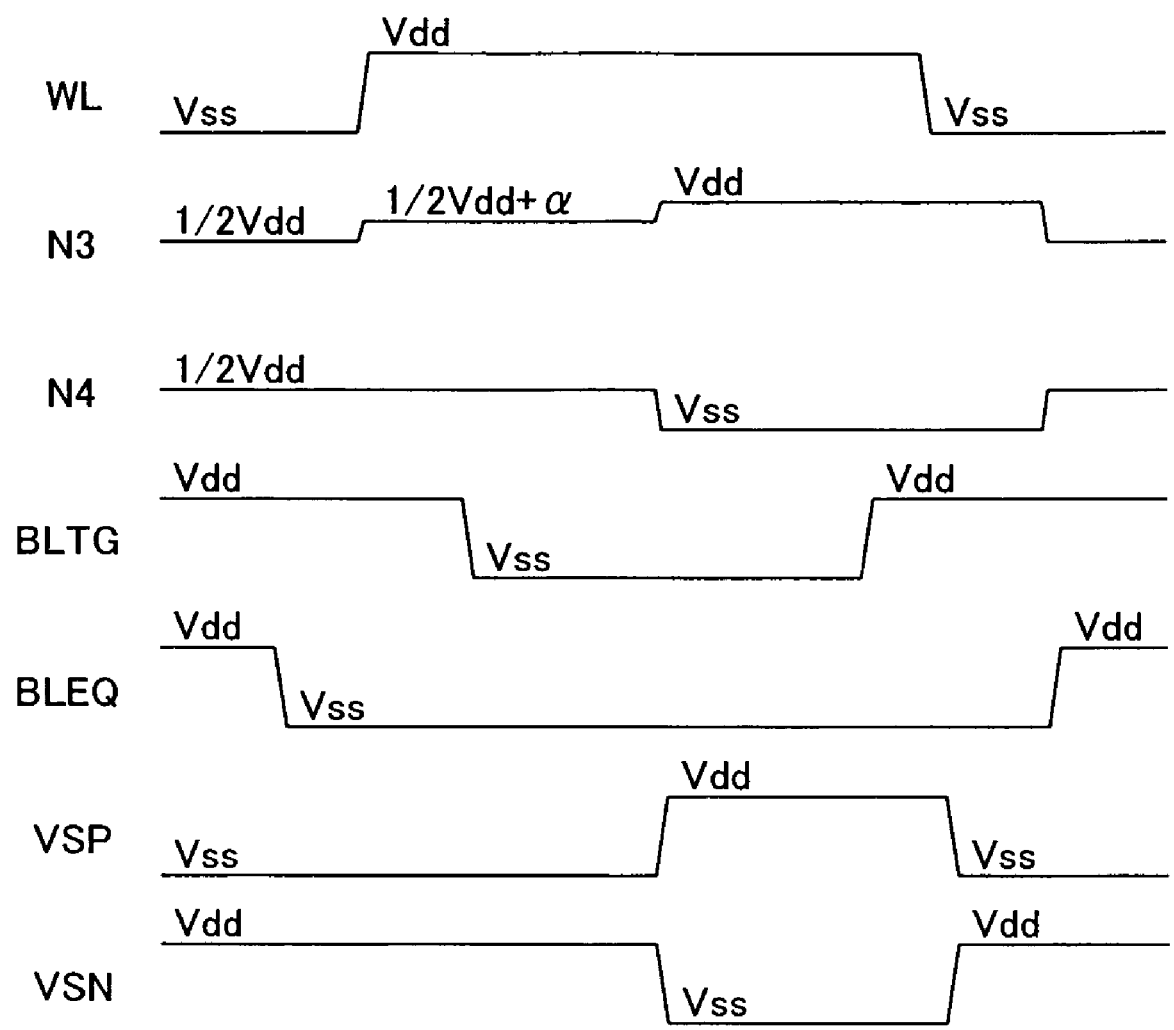
FIG. 9 is a voltage waveform diagram for illustrating read and rewrite operations of the DRAM employing the shift register circuit including the flip-flop circuits according to the second embodiment of the present invention.

In the data read and rewrite operations, the DRAM according to the second embodiment inputs a control signal BLTG of the potential Vdd in the gates of the n-channel transistors 23a and 23b thereby turning on the n-channel transistors 23a and 23b in an initial state, as shown in FIG. 9. At this time, the DRAM precharges the bit lines BL1 and BL2 to a potential ½Vdd, thereby setting both of the output nodes N3 and N4 of the inverter circuits 41 and 42 of the second-stage delay latch circuit 32b linked with the bit lines BL1 and BL2 respectively to the level ½Vdd through the n-channel transistors 23a and 23b. The DRAM further inputs a control signal BLEQ of the potential Vdd in the gate of the n-channel transistor 39 serving as an equalizer circuit, thereby turning on the n-channel transistor 39. Thus, the DRAM equalizes the potentials of the output nodes N3 and N4 with each other to the level ½Vdd through the n-channel transistor 39. The DRAM supplies power supply voltages VSP and VSN of the potentials Vss and Vdd to the latch circuit 38. Thus, the DRAM inactivates the latch circuit 38, thereby floating the potentials of both of the output nodes N3 and N4 of the inverter circuits 41 and 42. In the read and rewrite operations, the DRAM holds both of clock signals CLKM and CLKS at the potential Vss. Thus, the DRAM holds the transfer gate transistors 35 and 40 of the delay latch circuits 32a and 32b in OFF-states. It is assumed that the corresponding memory cell 21 stores high-level data.

Then, the DRAM lowers the potential of the control signal BLEQ input in the n-channel transistor 39 serving as an equalizer circuit to the level Vss. Thus, the n-channel transistor 39 enters an OFF-state. Then, the DRAM raises the potential of the word line WL to the level Vdd. Thus, the DRAM turns on the n-channel transistor 21a of the memory cell 21, thereby supplying charges held in the capacitor 21b to the corresponding bit line BL1 through the n-channel transistor 21a. Therefore, the potential responsive to the data held in the memory cell 21 appears on the bit line BL1. At this time, a potential (½Vdd+α) appears on the bit line BL1 due to the high-level data stored in the memory cell 21. Thereafter the DRAM lowers the potential of the control signal BLTG to the level Vss. Thus, the n-channel transistors 23a and 23b enter OFF-states. Thereafter the DRAM raises the potential of the power supply voltage VSP to the level Vdd, and lowers the potential of the power supply voltage VSN to the level Vss. Thus, the latch circuit 38 is activated for serving as a sense amplifier.

The latch circuit 38 compares the potentials of the output nodes N3 and N4 with each other and amplifies the difference therebetween. In other words, the latch circuit 38 raises the potential (½Vdd+α) of the output node N3 to the level Vdd, and lowers the potential ½Vdd of the output node N4 to the level Vss. Thus, the second-stage delay latch circuit 32b determines the potential of the bit line BL1 corresponding to the high-level data stored in the memory cell 21 as the high level (Vdd), so that the DRAM reads the high-level data from the memory cell 21.

The data held in the capacitor 21b of the memory cell 21 is destroyed through the aforementioned read operation. Therefore, the DRAM rewrites the data in the capacitor 21b of the memory cell 21 through the raised potential Vdd of the output node N3 after the read operation. More specifically, the DRAM raises the potential of the control signal BLTG to the level Vdd. Thus, the DRAM turns on the n-channel transistor 23a, thereby applying the potential (Vdd) of the output node N3 to the capacitor 21b through the n-channel transistor 23a, the bit line BL1 and the n-channel transistor 21a of the memory cell 21. The DRAM rewrites the high-level data in the capacitor 21b of the memory cell 21 in this manner.

An operation of transferring a potential from the node D of the shift register circuit 22 toward the node Q is described with reference to FIGS. 8 and 10. In this case, the DRAM according to the second embodiment operates basically identically to the operation of the shift register circuit according to the first embodiment shown in FIG. 1 for transferring the potential from the node D toward the node Q2. According to the second embodiment, however, the DRAM supplies the latch circuit 33 of the first-stage delay latch circuit 32a of the flip-flop circuit 31 with power supply voltages fixed to the levels Vdd and Vss for activating the latch circuit 33 dissimilarly to the aforementioned embodiment, and hence the output nodes N1 and N2 of the inverter circuits 36 and 37 of the latch circuit 33 do not enter floating states.

Figure 10:
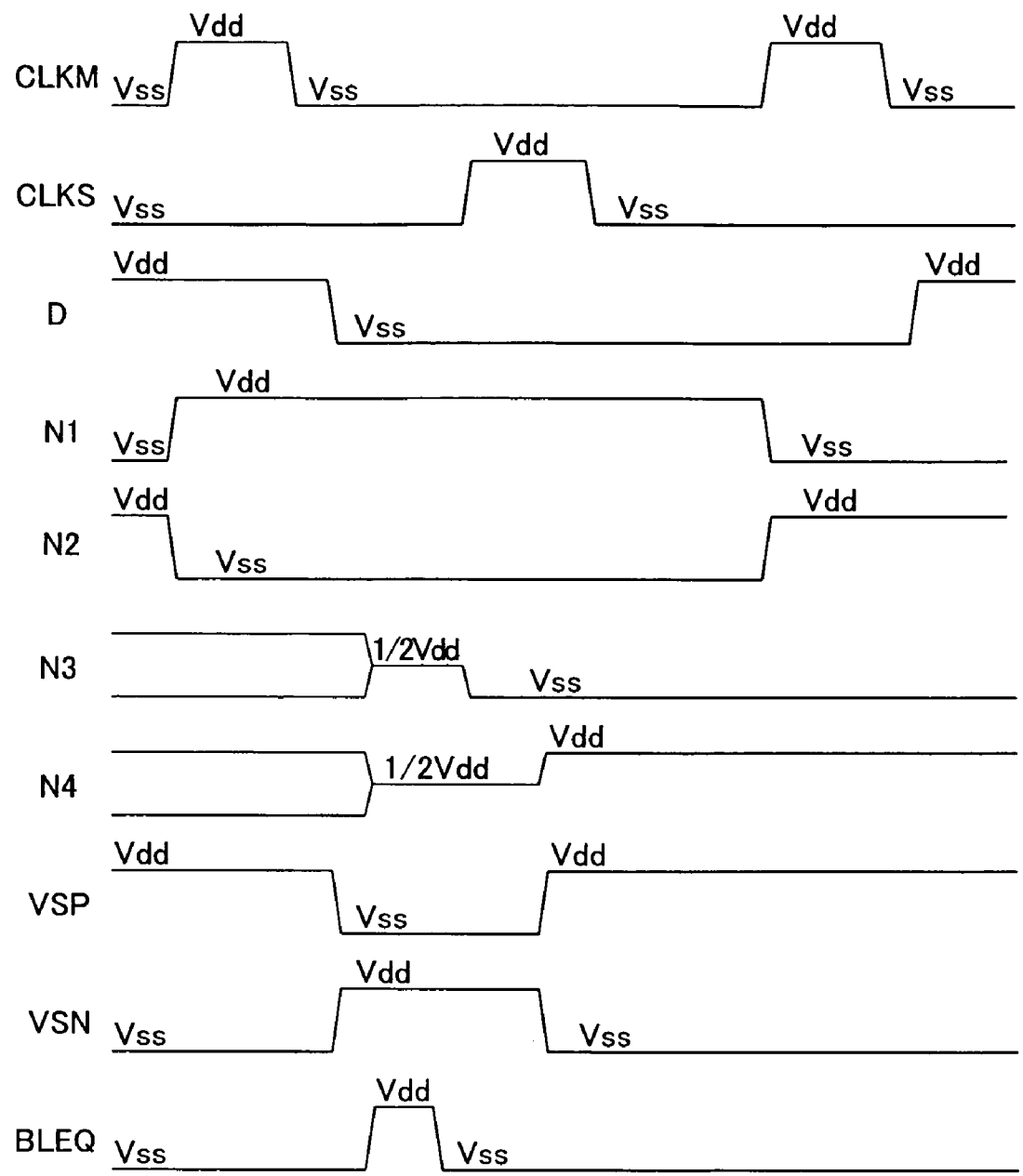
FIG. 10 is a voltage waveform diagram for illustrating a data transfer operation of the DRAM employing the shift register circuit including the flip-flop circuits according to the second embodiment of the present invention.
Figure 11:
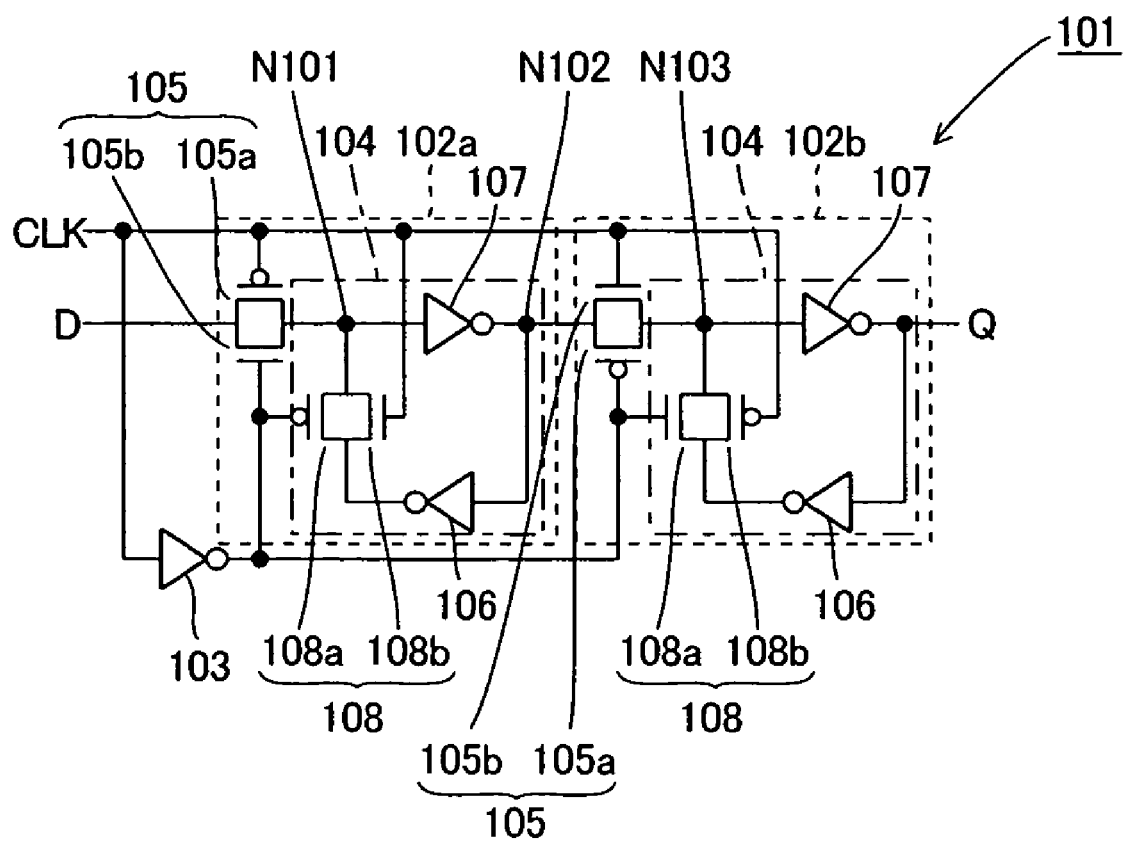
FIG. 11 is a circuit diagram showing the structure of an exemplary conventional flip-flop circuit.

According to the second embodiment, the potential of the clock signal CLKM rises from the initial level Vss to the level Vdd thereby turning on the transfer gate transistor 35 (see FIG. 8), as shown in FIG. 10. Thus, the DRAM inputs the potential Vdd in the output node N1 of the inverter circuit 36 from the node D through the transfer gate transistor 35. At this time, the potential of the output node N1 of the inverter circuit 36 rises to the level Vdd, while that of the output node N2 of the inverter circuit 37 falls to the level Vss. The DRAM supplying the fixed power supply voltages Vdd and Vss to the latch circuit 33 fixes the potentials (Vdd and Vss) of the output nodes N1 and N2.

Then, the DRAM transfers the potential (Vss) of the output node N2 of the inverter circuit 37 of the first-stage delay latch circuit 32a to the second-stage delay latch circuit 32b. At this time, the DRAM according to the second embodiment operates similarly to the shift register circuit employing the flip-flop circuits according to the aforementioned first embodiment.

Thus, the DRAM sequentially transfers data (potential) input from the node D downward in the shift register circuit 22 shown in FIG. 8 while shifting transfer timing. After transferring the data to the delay latch circuit 32b corresponding to the memory cell 21 for receiving the data (potential), the DRAM raises the potential of the word line WL linked with the memory cell 21 to the level Vdd, thereby writing the data in the capacitor 21b through the delay latch circuit 32b, the n-channel transistor 23a, the bit line BL1 and the n-channel transistor 21a of the memory cell 21.

According to the second embodiment, as hereinabove described, the delay latch circuit 32b of each flip-flop circuit 31 applied to the shift register circuit 32 functions also as a sense amplifier determining the levels of the potentials of the output nodes N3 and N4 of the inverter circuits 41 and 42 and amplifying the difference therebetween, whereby the DRAM can determine the data stored in the memory cell 21 and amplify the difference between the potential corresponding to this data and the reference potential (½Vdd) by inputting the potential corresponding to the read data in the output node N3 of the inverter circuit 41 of the delay latch circuit 32b while inputting the reference potential ½Vdd in the output node N4 of the inverter circuit 42 when reading the data stored in the memory cell 21. Thus, the DRAM to which the shift register circuit 22 including the flip-flop circuits 31 is applied can share a sense amplifier and the delay latch circuit 32b of each flip-flop circuit 31 of the shift register circuit 22. Therefore, the DRAM to which the shift register circuit 22 including the flip-flop circuits 31 is applied can be reduced in circuit scale.

According to the second embodiment, the DRAM, capable of suppressing increase of the circuit scale while suppressing increase of current consumption, can attain effects similar to those of the aforementioned first embodiment in addition to the aforementioned effect.

Although the present invention has been described and illustrated in detail, it is clearly understood that the same is by way of illustration and example only and is not to be taken by way of limitation, the spirit and scope of the present invention being limited only by the terms of the appended claims.

For example, while the shift register circuit including the inventive flip-flop circuits is applied to a DRAM in the aforementioned second embodiment, the present invention is not restricted to this but the shift register circuit including the inventive flip-flop circuits is applicable to various semiconductor devices other than the DRAM. For example, the shift register circuit including the inventive flip-flop circuits can be applied to a memory, such as a ferroelectric memory employing ferroelectric capacitors for memory cells storing data, other than the DRAM. The shift register circuit including the inventive flip-flop circuits can also be applied to a semiconductor device, such as part of a circuit of a multiplier or a divider, a driving circuit for pixel lines of a liquid crystal display or a tap point (delay line drawing part) selection circuit of a DLL (delay locked loop) circuit, other than the memory.

What is claimed is:

1. A flip-flop circuit comprising a first latch circuit including a first inverter circuit and a second inverter circuit as well as a first equalizer circuit equalizing the potential of an output node of said first inverter circuit and the potential of an output node of said second inverter circuit with each other, wherein
a first power supply line capable of switching a supplied potential between a fixing potential supplied for fixing the potential of said output node of said first inverter circuit and the potential of said output node of said second inverter circuit and a floating potential supplied for floating the potential of said output node of said first inverter circuit and the potential of said output node of said second inverter circuit is connected to said first latch circuit,
one of said output node of said first inverter circuit and said output node of said second inverter circuit is connected to an output node of said first latch circuit, the flop-flop circuit further comprising
a second latch circuit including a third inverter circuit having an output node connected to said output node of said first latch circuit, a fourth inverter circuit and a second equalizer circuit equalizing the potential of said output node of said third inverter circuit and the potential of an output node of said fourth inverter circuit with each other, wherein
a second power supply line capable of switching a supplied potential to said fixing potential supplied for fixing the potential of said output node of said third inverter circuit and the potential of said output node of said fourth inverter circuit and said floating potential supplied for floating the potential of said output node of said third inverter circuit and the potential of said output node of said fourth inverter circuit is connected to said second latch circuit, and
at least one of the first equalizer circuit and the second equalizer circuit consists of one transistor.

2. The flip-flop circuit according to claim 1, wherein said second power supply line is held at said floating potential when a prescribed potential in said output node of either said third inverter circuit or said fourth inverter circuit is inputted.

3. The flip-flop circuit according to claim 2, wherein
said second power supply line includes a third potential supply line and a fourth potential supply line supplied with a potential inverted with respect to a potential supplied to said third potential supply line, and
said third potential supply line is held at a first potential while said fourth potential supply line is held at a second potential when said prescribed potential is input in said output node of either said third inverter circuit or said fourth inverter circuit.

4. The flip-flop circuit according to claim 3, wherein
said third inverter circuit includes a p-type fifth transistor and an n-type sixth transistor while said fourth inverter circuit includes a p-type seventh transistor and an n-type eighth transistor,
the gates of said p-type fifth transistor and said n-type sixth transistor of said third inverter circuit are connected to said output node of said fourth inverter circuit while the gates of said p-type seventh transistor and said n-type eighth transistor of said fourth inverter circuit are connected to said output node of said third inverter circuit, and
said third potential supply line is connected to either the source region or the drain region of said p-type fifth transistor of said third inverter circuit and either the source region or the drain region of said p-type seventh transistor of said fourth inverter circuit while said fourth potential supply line is connected to either the source region or the drain region of said n-type sixth transistor of said third inverter circuit and either the source region or the drain region of said n-type eighth transistor of said fourth inverter circuit.

5. The flip-flop circuit according to claim 4, wherein said third potential supply line is held at said second potential while said fourth potential supply line is held at said first potential when the potential of said output node of said third inverter circuit and the potential of said output node of said fourth inverter circuit are fixed, and
all of said fifth and sixth transistors of said third inverter circuit and said seventh and eighth transistors of said fourth inverter circuit are turned off by switching the potential of said third potential supply line from said second potential to said first potential while the potential of said fourth potential supply line is switched from said first potential to said second potential when the potential of said output node of said third inverter circuit and the potential of said output node of said fourth inverter circuit are floated.

6. The flip-flop circuit according to claim 1, wherein said second equalizer circuit equalizes the potential of said output node of said third inverter circuit and the potential of said output node of said fourth inverter circuit with each other before a prescribed potential is input in said output node of either said third inverter circuit or said fourth inverter circuit.

7. The flip-flop circuit according to claim 6, wherein said second equalizer circuit is constituted of a transistor, and either the source region or the drain region of said transistor constituting said second equalizer circuit is connected to said output node of said third inverter circuit, while either the drain region or the source region of said transistor constituting said second equalizer circuit is connected to said output node of said fourth inverter circuit.

8. The flip-flop circuit according to claim 6, wherein said second latch circuit further includes a transfer gate transistor, and said prescribed potential is input in said output node of either said third inverter circuit or said fourth inverter circuit through said transfer gate transistor.

* * * * *